US006783914B1

(12) United States Patent
Fedynyshyn

(10) Patent No.: US 6,783,914 B1
(45) Date of Patent: *Aug. 31, 2004

(54) ENCAPSULATED INORGANIC RESISTS

(75) Inventor: Theodore H. Fedynyshyn, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/512,942

(22) Filed: Feb. 25, 2000

(51) Int. Cl.$^7$ .......................... G03F 7/023; G03F 7/039
(52) U.S. Cl. ....................... 430/190; 430/191; 430/192; 430/193; 430/270.1
(58) Field of Search ................................ 430/190, 191, 430/192, 193, 270.1

(56) References Cited

U.S. PATENT DOCUMENTS

| | | | |
|---|---|---|---|
| 3,148,983 A | | 9/1964 | Endermann et al. |
| 3,660,097 A | * | 5/1972 | Mainthia ........................ 96/91 |
| 3,801,327 A | | 4/1974 | Moreau ..................... 96/115 R |
| 3,869,292 A | | 3/1975 | Peters |
| 3,954,678 A | | 5/1976 | Marquisee |
| 4,115,128 A | | 9/1978 | Kita |
| 4,202,697 A | | 5/1980 | Van Goethem et al. ...... 430/306 |
| 4,246,374 A | | 1/1981 | Kopchik |
| 4,286,046 A | | 8/1981 | Cohen et al. |
| 4,336,319 A | * | 6/1982 | Nagashima et al. ......... 430/165 |

(List continued on next page.)

FOREIGN PATENT DOCUMENTS

| | | |
|---|---|---|
| EP | 0619524 A1 | 10/1994 |
| EP | 0901043 A1 | 10/1994 |
| JP | A 63077952 A1 | 4/1988 |
| JP | 1020438 | 1/1989 |
| JP | 0324279 | 3/1991 |
| JP | 3237113 | 10/1991 |
| JP | A 05015772 A1 | 1/1993 |
| JP | 5216232 | 8/1993 |
| JP | 0836265 | 2/1996 |
| WO | WO 00/20926 | 4/2000 |

OTHER PUBLICATIONS

Theodore H. Fedynyshyn, et al, Encapsulated Inorganic Resist Technology, Proceedings of SPIE vol. 3999, pp. 627–637 (2000).
Database WPI, Section Ch, Week 199309, Derwent Publications Ltd., London GB; Class A32; AN 1993–070329 XP002178169 and JP 05 015772 A, Jan 26, 1993 Abstract.
Patent Abstracts of Japan, vol. 012, No. 306 (C–522), Aug. 19, 1988 and JP 63 077952A (Nippon Zeon Co Ltd.), Apr. 8, 1988 Abstract.
Baidina, I., Podberezskaya, N., Borisov, S., Alekseev, V., Martynova, I., and Kanev, A. Zh. Strukt. Khim. 21, 125 (1980).
Clegg, W., Sheldrick, G., and Vater, N. Acta Crystallogr. 38B, 3162 (1980).

(List continued on next page.)

Primary Examiner—John S. Chu
(74) Attorney, Agent, or Firm—Thomas J. Engellenner; Reza Mollaaghababa; Nutter McClennen & Fish LLP

(57) ABSTRACT

The present invention describes encapsulated inorganic resists which are compatible with conventional resist processing such as spin casting from organic solvents and development with aqueous 2.38% TMAH developers. The resist includes encapsulated inorganic materials as resist components, a fact that significantly increases the plasma etch selectivity of the resists compared to conventional polymeric resists. In effect, these resist systems act as a photoimagable single layer hard mask, although use as the top layer in a bilayer resist scheme is contemplated.

15 Claims, 6 Drawing Sheets

Comparison of contrast curves of three EIRT resists of improved formulation.

U.S. PATENT DOCUMENTS

| | | | |
|---|---|---|---|
| 4,377,631 | A | 3/1983 | Toukhy et al. |
| 4,404,272 | A | 9/1983 | Stahlhofen |
| 4,404,357 | A | 9/1983 | Taylor et al. |
| 4,423,138 | A | 12/1983 | Guild |
| 4,424,315 | A | 1/1984 | Taylor et al. |
| 4,439,516 | A | 3/1984 | Cernigliaro et al. |
| 4,491,628 | A | 1/1985 | Ito et al. |
| 4,791,171 | A | 12/1988 | Cunningham |
| 4,931,379 | A | 6/1990 | Brunsvold et al. |
| 4,939,070 | A | 7/1990 | Brunsvold et al. |
| 5,047,313 | A | 9/1991 | Nebe et al. |
| 5,420,000 | A | 5/1995 | Patel et al. |
| 5,556,716 | A | 9/1996 | Herron et al. |
| 5,648,159 | A | 7/1997 | Sato ............................ 428/327 |
| 5,691,101 | A * | 11/1997 | Ushirogouchi et al. ..... 430/176 |
| 5,753,722 | A | 5/1998 | Itokawa et al. ................ 522/83 |
| 5,942,369 | A * | 8/1999 | Ota et al. ..................... 430/192 |
| 5,998,084 | A * | 12/1999 | Elsaesser et al. ........... 430/165 |
| 6,096,479 | A | 8/2000 | Kawamura et al. |
| 6,114,083 | A * | 9/2000 | Kawamura et al. ....... 430/270.1 |
| 6,190,825 | B1 * | 2/2001 | Denzinger et al. .......... 430/192 |

OTHER PUBLICATIONS

Kloster–Jensen, E., and Rimming. C. Acta Chem. Scand. 40B, 604 (1986).

Mertesdor, C., et al. Microelectronics Technology, 1995, pp. 35–55.

Brinker et al., Sol–Gel Science, Academic Press, Inc. p. 97.

Bruachi, P. et al., "Gas Sensing with Conducting Polymer Thin Film Resistors Obtained From Commercial Photoresist Patterns," *Sens. Microsyst., Proc Iml. Conf.*, Di Natale et al. (Edition), 69–73 (1996).

Crivello, J. and Mao, Z., "Preparation and Cationic Photopolymerization of Organic–Inorganic Hybrid Matrixes," *Chem. Mater.*, vol. 9, 1562–1569 (1997).

Dagani, R., "Putting the 'Nano' into Composites," *Chemical*, 25–37 (Jun. 7, 1999).

Dumpich, G. et al., "Direct Writing of Metallic Nanostructures by Means of Metal Colloids," *Materials Science Forum*, vols. 287–8, 413–6 (1998).

Kaplan, L.H. and Zimmerman, S.M., "Enhanced E–Beam Sensitivity of Resist," *IBM Technical Disclosure Bulletin*, vol. 21, No. 7, p. 2823 (Dec. 1978).

Muchs, et al., "Plasma Etching of Materials Used in Microelectronic Manufacturing," *Introduction to Microlithography*, L. Thompson et al., (editors), 449–64 (1994).

Pu, Jin–Ling et al., "Photobinding of Colloidal Particles by Means of Surface Modification," *Journal of Imaging Science*, vol. 32, No. 3, 129–34 (May/Jun. 1988).

Pu, Jin–Ling et al., "Photobinding of Colloidal Particles by Means of Surface Modification. II. Surface Azido Density and Dispersibility," *Journal of Imaging Science*, vol.32, No. 6, 232–7 (Nov./Dec. 1988).

Pu, J.–L. et al., "Photobinding of Colloidal Particles by Means of Surface Modification, III. Influences of Dispersibility and Photoactivity of Azido Groups on the Colloidal Surface," *Journal of Imaging Science*, vol. 33, No. 1, 33–35 (Jan./Feb. 1989).

Vossmeyer, T. et al., "Light–Directed Assembly of Nanoparticles," *Angew. Chem. Int. Ed. Engl.*, vol. 36, No. 10, 1080–3 (1997).

Zambounis, J.S. et al., "Latent Pigments Activated by Heat," *Nature*, vol. 388, 131–2 (Jul. 10, 1997).

* cited by examiner

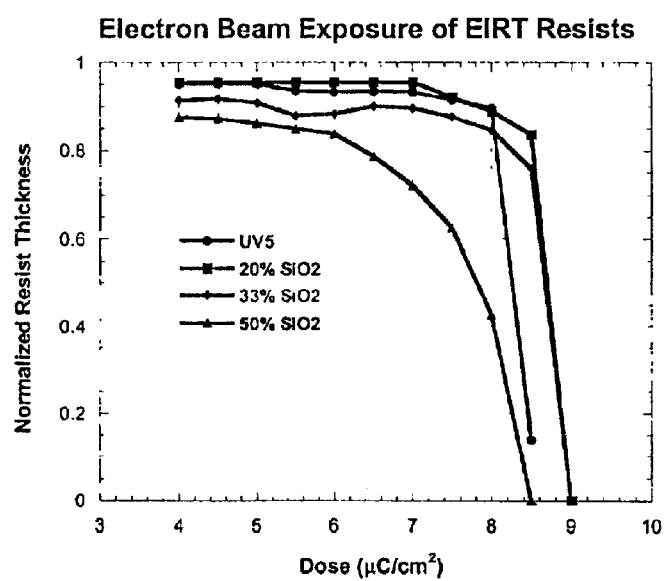
Figure 1  Comparison of contrast curves of EIRT resists and the commercial resist UV5 with electron beam exposure.

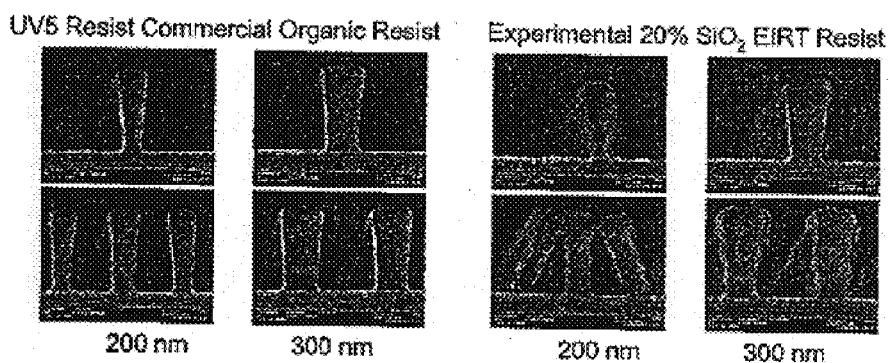
Figure 2. Comparison of electron beam imaging of 200 and 300-nm dense and isolated lines of an EIRT resist and the commercial resist UV5.

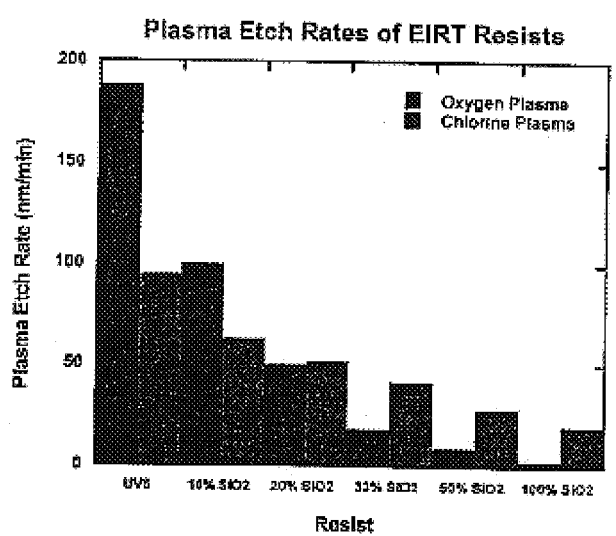
Figure 3. Comparison of RIE etch rates of resists containing increasing amounts of $SiO_2$ in both an oxygen and chlorine plasma.

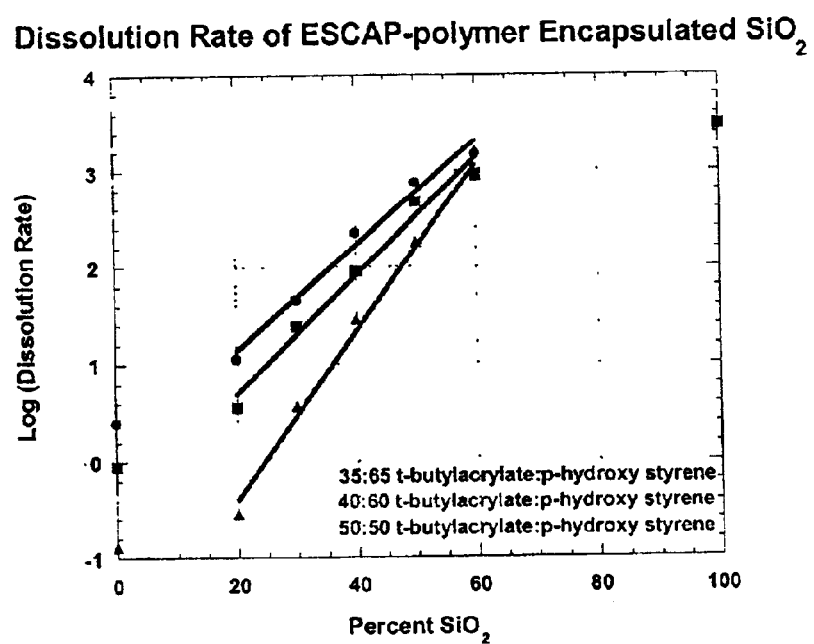
Figure 4. Dissolution rates of three different polymers with varying levels of SiO$_2$ incorporation.

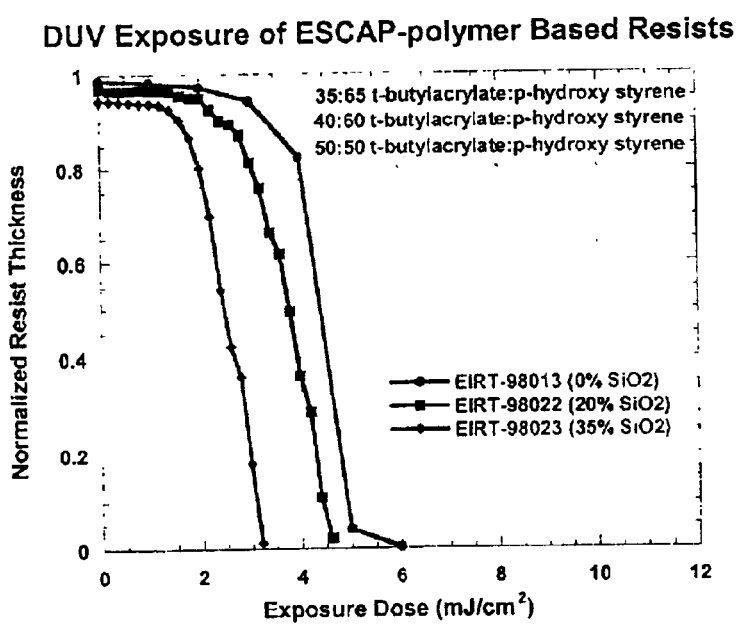
Figure 5. Comparison of contrast curves of three EIRT resists of improved formulation.

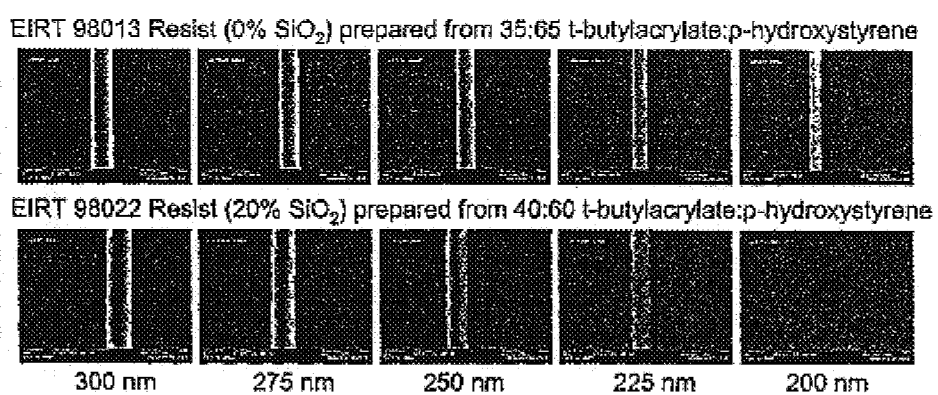
Figure 6. Comparison of 248-nm imaging (NA ~ 0.48) of isolated lines of a 20% $SiO_2$ containing EIRT resist and a resist containing no $SiO_2$.

ENCAPSULATED INORGANIC RESISTS

STATEMENT REGARDING FEDERALLY SPONSORED RESEARCH

The U.S. government has rights in this invention pursuant to a contract awarded by the Advanced Lithography Program of the Defense Advanced Research Projects Agency under Air Force Contract F19628-95-C-0002.

BACKGROUND OF THE INVENTION

Processes for patterning semiconductor wafers typically rely on lithographic transfer of a desired image from a thin-film of radiation-sensitive resist material. The process entails the formation of a sacrificial layer, the "resist", which is photo-lithographically patterned. Generally these resists are referred to as "photoresists".

The patterning of the resist involves several steps, including exposing the resist to a selected light source through a suitable mask to record a latent image of the mask and then developing and removing selected regions of the resist. For a "positive" resist, the exposed regions are transformed to make such regions selectively removable; while for a "negative" resist, the unexposed regions are more readily removable.

The pattern can be transferred into surface texture in the wafer by etching with a reactive gas using the remaining, patterned resist as a protective masking layer. Alternatively, when a wafer is "masked" by the resist pattern, it can be processed to form active electronic devices and circuits by deposition of conductive or semiconductive materials or by implantation of dopants.

Materials used in single layer photoresists for optical lithography should meet several objectives. Low optical density at the exposure wavelength and resistance to image transfer processes, such as plasma etching, are two important objectives to be met by such a photoresist material. Shorter wavelengths of radiation permit greater resolution. The most common wavelengths currently used in semiconductor lithography are 365 nm and 248 nm. The desire for narrower linewidths and greater resolution has sparked interest in photoresist materials that can be patterned by even shorter wavelengths of light.

All manufacturing of integrated circuits has been enabled by high-performance spin-on organic polymeric photoresists. If organic resists continue in their critical role within the ever shrinking resolution demands of advanced lithography, the stringent process window demands at sub-100 nm resolution will need to be met by resists possessing sufficient sensitivity to meet the equally demanding required throughput.

Resists should maintain critical linewidth control throughout the patterning process, including both imaging and subsequent transfer via plasma etch. Line-edge roughness on the order of 5 to 10 nm is a concern at 250 nm, but will render a lithographic process unworkable when critical dimensions fall to below 100 nm. Furthermore, transferring imaged patterns via plasma etch requires that a sufficient resist be present to act as an etch mask, but single layer resists appear to be limited by an aspect ratio of 3:1. As critical features approach 25 nm, resist thickness is expected to drop to under 100 nm, a thickness that does not allow plasma image transfer even with a several fold improvement in plasma etch selectivity.

Unless plasma etch selectivity increases several fold (an unlikely event with organic based resists) single layer resist chemistry will cease to be practical at sub-100 nm resolution. Multilayer resist schemes offer the capability of increased aspect ratio, but they add to the process complexity and cost. Therefore, a need exists to provide photoresists which meet these challenging demands.

SUMMARY OF THE INVENTION

This invention generally relates to photoresist materials useful in lithography and, particularly, to improved materials and methods for pattern formation on semiconductor wafers.

The present invention pertains to encapsulated inorganic resist technology (EIRT) and their methods of preparation which represents a fundamentally new type of resist concept, which is compatible with conventional resist processing. In resists of the invention, an inorganic core particle or colloidal particle is encapsulated under a photochemically active layer, which upon exposure can modify the particle's solubility, leading to developer differentiation.

In one aspect of the invention, encapsulated inorganic resists represent a fundamentally new type of resist material, which is compatible with conventional resist processing such as spin casting from organic solvents and development with aqueous 2.38% TMAH developers. A key feature of the resist is the use of encapsulated inorganic materials as resist components, a fact that significantly increases the plasma etch selectivity of EIRT (encapsulated inorganic resist technology) resists compared to conventional polymeric resists. In effect, these resist systems act as a photoimagable single layer hard mask, although use as the top layer in a bilayer resist scheme is contemplated.

The present invention pertains to the surprising discovery that durable, high resolution photosensitive resist compositions, e.g. on the order of molecular pixel sizes of less than 10 nanometers (nm), can be prepared from the combination of a resin binder and an encapsulated inorganic material, e.g., a metallic oxide. The particle dispersions have solution characteristics and allow conventional resist processing. The photosensitive resist composition can be either a positive or negative photosensitive resist, depending upon the resin binder system chosen.

The encapsulated inorganic materials useful in the invention include metals, metal salts and metallic oxides. For example, metallic oxides useful in the invention are the oxides of silicon, aluminum and titanium. Typically the content of the encapsulated inorganic material is between about 0.1% and about 90% by weight of the photosensitive resist composition; preferably between about 5.0% and about 75% and most preferably between about 10% to about 50% by weight. In a most preferred embodiment, the binder and the encapsulated inorganic material form a clear photosensitive resist composition. This clear composition is transparent or translucent to the eye and can be considered a solution or a dispersion. It has been unexpectedly discovered that the combination of the encapsulated inorganic material and resin binder forms a clear solution without precipitation of the encapsulated inorganic material from solution. This unexpected advantage provides one of ordinary skill in the art with the ability to coat a substrate without having to take any additional steps to insure that the energy applied to the photosensitive film to cure the film without having inconsistencies within the photoresist film caused by suspended opaque solids.

Silicon containing particles, e.g., 1–5 nm diameter particles (commercially available as 8–10 nm particles) of this size offer two important advantages in resist design. First, the small molecular size allows for high resolution systems with a relatively small molecular pixel size of less than 5 nm. This can be compared to traditional organic polymer based resists, which have polymeric molecular weights between 5,000 and 20,000 Daltons and molecular pixel sizes of 4 to 9 nm. Critical dimension control and line edge roughness at sub-100-nm resolution is extremely sensitive to the fine details of the molecular structure including the molecular pixel size. Secondly, particle dispersions comprised of this small molecular size behave for all intents and purposes as a solution and allow conventional resist processing including spin casting from organic solvents and aqueous base, such as 2.38% TMAH development.

The photosensitive resist compositions of the invention can further include a surfactant and/or a solvent.

The photosensitive resist compositions of the invention are sensitive to conventional 455 nm (g-line), 405 nm (h-line), or 365 nm (i-line) steppers; at either 248 or 193 nm due to decreased resist absorbance; and/or sensitive to imaging sources such as 157 nm, EUV, e-beam, x-ray, ion beam, and other sub-200 nm wavelengths.

Other advantages of the invention will be readily apparent to one having ordinary skill in the art upon reading the following description.

All percentages by weight identified herein are based on the total weight of the photosensitive resist composition unless otherwise indicated.

BRIEF DESCRIPTION OF THE DRAWINGS

The invention will be more fully understood from the following detailed description taken in conjunction with the accompanying drawings, in which:

FIG. 1 is a comparison of contrast curves of EIRT resists and commercial resist UV5 with electron beam exposure;

FIG. 2 is a comparison of electron beam imaging of 200 and 300 nm dense and isolated lines of EIRT resists and the commercial resist UV5;

FIG. 3 is a comparison of RIE etch rates of resists containing increasing amounts of $SiO_2$ in both an oxygen and chlorine plasma;

FIG. 4 shows dissolution rates of three different polymers with varying levels of $SiO_2$ incorporated therein;

FIG. 5 is a comparison of contrast curves of three EIRT resists of an improved formulation; and FIG. 6 is a comparison of 248 nm imaging of isolated lines of a 20% $SiO_2$ containing EIRT resists and a resist containing no $SiO_2$.

DETAILED DESCRIPTION OF THE INVENTION

The features and other details of the invention will now be more particularly described and pointed out in the claims. It will be understood that the particular embodiments of the invention are shown by way of illustration and not as limitations of the invention. The principle features of this invention can be employed in various embodiments without departing from the scope of the invention.

Generally, photoresists are photosensitive films used in projection lithography for transfer of images to a substrate. They form negative or positive images. After coating a substrate with a photoresist, the coated substrate is exposed to a source of activating radiation. This radiation exposure causes a chemical transformation in the exposed areas of the coated surface. After the radiation exposure step, the photoresist-coated substrate is treated with a developer solution to dissolve or otherwise remove either the radiation-exposed or unexposed areas of the coated substrate, depending upon the type of photoresist used.

For example, unfortunately, most photoresist materials absorb extreme ultraviolet (EUV) radiation strongly in the range of 4.5–15 nm. While this is advantageous from the standpoint of resist speed (i.e. the exposure dose required to form a pattern) and the associated printing rate, it poses a serious problem for projection lithographic methods that employ EUV radiation because of highly nonuniform absorption of this radiation through the photoresist thickness. In present photoresist materials, EUV radiation will not penetrate much beyond a film thickness of 0.10 or 0.15 $\mu$m. Yet, to fabricate holes and other structures in semiconductor materials such as silicon, as well as metals, or dielectrics, the photoresist layer must be thick enough, preferably 0.5–1.0 $\mu$m, to withstand etching and other processing steps. Accordingly, in order to make use of the increased resolution afforded by the use of EUV radiation, e-beam, and other suitable energetic systems in the processing and fabrication of small structures, photoresist schemes need to be employed that can be used in conjunction with high resolution radiation and yet are compatible with conventional lithographic processing methods.

Advanced sub-100-nm imaging schemes offer a wide variety of potential energy sources employing both masked and maskless technologies, such as X-rays, EUV, low-and high-kV electrons, electron beams, x-rays, ion beams, and extended optical wavelengths. From a resist viewpoint, all advanced energy sources can be categorized as one of two types. Highly penetrating energy, such as X-ray or high-kV electrons, is only partially absorbed by the resist layer with much of the exposure energy passing into the underlying substrate. Highly absorbing energy, such as EUV and low-kV electrons, is fully absorbed by the top surface of the resist. The novel encapsulated inorganic resist system allows low aspect ratio imaging while maintaining the capability for conventional resist processing for both highly penetrating and highly absorbing energy.

Resolution in traditional single layer organic resists has been limited by the inability to image at aspect ratios (resist height to image width) of much greater then 3:1. Unless plasma etch selectivity increases several fold (an unlikely event with organic based resists) single layer resist chemistry will cease to be practical at sub-100-nm resolution. Multilayer resist schemes offer the capability of increased aspect ratio, but they add to the process complexity and cost. Encapsulated inorganic materials as resist components are ultimately capable of sub-100-nm resolution with sufficient plasma etch selectivity. These resist systems act as a single layer hard mask compatible with existing resist processing steps.

The term "encapsulated" is intended to mean that the encapsulated inorganic material is solvated by the binder resin, a solvent, an additive or combinations thereof. Not to be limited by theory, the solvation of the encapsulated inorganic material can be by coating of the particle, by covalent interactions between the encapsulated inorganic material and binder resin, solvent or an additive, or by ionic interactions between the encapsulated inorganic material and binder resin, solvent or an additive. The encapsulated inorganic material is considered suspended or solvated by the resin binder system, solvent or additive, or combinations thereof and appears to be dissolved, forming a clear or translucent sol/gel.

Suitable inorganic materials which can be used as inorganic particles in encapsulated inorganic resist technology (EIRT) include metals, metal salts, metallic oxides, and combinations thereof. Suitable metals those in Groups VIB, VIIB, VIIIB, IB, IIB, IIA, IVA, VA ,VIA and combinations thereof. Suitable examples of metals include titanium, vanadium, cobalt, hafnium, boron, gold, silver, silicon, aluminum, copper, zinc, gallium, magnesium, indium, nickel, germanium, tin, molybdenum, niobium, zirconium, platinum, palladium, antimony, and combinations thereof. Suitable examples of metal salts include halides, carbides and nitrides, such as silicon carbide, silicon nitride and combinations thereof. Examples of metallic oxides include those available from the Groups mentioned above and combinations thereof. Suitable examples include magnesium oxide, iron (III) oxide, aluminum oxide, chromium oxide, zinc oxide, titanium dioxide, silicon dioxide and combinations thereof. In general, the particle size of the inorganic core particle is between about 1 and 100 nm. Preferably, the average particle size (diameter) of the inorganic core particles is between about 1 and about 50 nm, preferably between about 1 and about 20 nm, more preferably between about 1 and about 10 nm, and most preferably less than 5 nm.

Typically the percentage content of the inorganic particle is between about 0.1% and about 90% by weight of the photosensitive resist composition; preferably between about 5% and about 75% and most preferably between about 10% and about 50% by weight.

In a most preferred embodiment, the binder and the encapsulated inorganic material form a clear photosensitive resist composition. This clear composition is transparent or translucent to the eye and can be considered a solution or a dispersion. It has been unexpectedly discovered that the combination of the encapsulated inorganic material and resin binder forms a clear solution without precipitation of the encapsulated inorganic material from solution. This unexpected advantage provides one of ordinary skill in the art with the ability to coat a substrate without having to take any additional steps to insure that the energy applied to the photosensitive film cures the film without having inconsistencies within the photoresist film caused by suspended opaque solids.

Typically, the thickness of the polymer binder and encapsulated inorganic material on the substrate is between about 10 and about 1000 nm, preferably between about 50 and about 500 nm. This thickness range of the coating is generally considered not able to withstand downstream processing, e.g., etching, plasma etching, of the substrate. However, the present invention provides thin polymeric/ encapsulated inorganic material films that can withstand downstream processing while allowing radiant energy to penetrate the entire thickness of the film.

For example, the encapsulated inorganic species colloidal silica ($SiO_2$) can be prepared in 1–5 nm diameter particles, and is commercially available as 8–10 nm and 10–20 nm particles. Silicon containing particles of this size offer two important advantages in resist design. First, the small molecular size allows development of high resolution systems with a relatively small molecular pixel size of less then 10 nm. Secondly, particle dispersions comprised of this small molecular size behave for all intents and purposes as a solution and allow conventional resist processing. Common to all of these options is the absorption of organic molecules on the particle surface to reduce their attractive forces. The stability of particle dispersions in organic solvents depends on the ability of an organic molecule to concentrate at the solid-liquid interface and form a solvated layer of sufficient thickness to overcome London Van der Waals attractive forces between the solid particles. There are three methods to achieve such barrier layers that counter the attractive forces. One is by adsorption of polymer molecules, such as random copolymers, block copolymers, and graft copolymers. This method can be used, but it can yield unstable systems due to the low dissociation energy of about 5 kcal/mole. A second method is through adsorption of long chain alcohols, acids, or bases. This yields a more stable system with dissociation energy of about 20 kcal/ mole. The fumal method of chemically reacting particles to form covalent compounds can lead to very strong anchoring with dissociation energies of about 80 to 90 kcal/mole which leads to long term dispersion stability, Encapsulated inorganic resists of the invention required the development of new materials that contain up to four functional properties segregated into distinct areas in one chemical species. These properties include one or more of: a plasma etch resistant encapsulated inorganic material, an organic anchoring site which adsorbs or bonds to the inorganic surface, an organic solvating portion to give dispersion stability, and a lithographic functionality capable of providing radiation or ion induced dissolution differentiation in developer. The lithographic functionality may be imported by photo-labile groups such a DNQ in a non-amplified resist design strategy, or by acid-labile groups such as t-butyl esters, acetals, or crosslinking agents in a chemically amplified resist (CAR) design strategy.

In one embodiment, the encapsulated inorganic material is coated with either a photo-labile or an acid-labile dispersant and employs either a direct or acid catalyzed solubility transformation. Such a material not only forms a stable dispersant, which allows for traditional spin casting, but also, on exposure, forms a base-soluble dispersant capable of wet development. Photo-labile dispersants can be formed by either adsorption of diazonaphthoquinone (DNQ) modified polymers or with DNQ attached directly to the particle via an organic bridging moiety. Exposure to such a film by actinic radiation or electrons effects a transformation to indenecarboxilic acid and allows for positive image formation after development. Acid-labile dispersants can be formed by adsorption of either blocked polyhydroxystyrene or by covalently attaching either blocked carboxylic acids or blocked phenols. A photo-generated acid can then be employed to catalyze a deblocking reaction and allow for positive image formation after development. It is also possible to either adsorb or chemically bond phenolic functionality which in the presence of the photo-generated acid and a crosslinking agent will give a negative image after development.

A related method to give encapsulated inorganic materials is to employ organosiloxane ring compounds in which a variety of $Si_8$ to $Si_{14}$ compounds are known (See for example, I. Baidina, N. Podberezskaya, S. Borisov, V. Alekseev, I Martynova, and A. Kanev, *Zh. Strukt. Khim.* 21, 125 (1980); W. Clegg, G. Sheldrick, and N. Vater, *Acta Crystallogr.* 38B, 3162 (1980); E. Kloster-Jensen and C. Romming, *Acta Chem. Scand.* 40B, 604 (1986)). These compounds have silicon and oxygen structures comprising the backbone of the ring with organic substituents facing the environment. Substitution of either DNQ blocked carboxylic acids, blocked phenols, or phenols on the extremity of the ring provides the proper functionality to the system to allow for use as a resist.

The resin binder useful in the invention is nonlimiting, and can be chosen from those resin binder systems currently available to those of ordinary skill in the art. For example, most commercial photoresist formulations, both positive and negative, comprise a film forming resin binder and a radiation sensitive component, e.g., a photo acid generator, (PAG). Suitable examples include t-BOC p-hydroxy styrene/p-hydroxy styrene copolymers, t-butyl acrylate/p-hydroxy styrene copolymers or t-butylacrylate/p-hydroxystyrene/styrene terpolymers, acrylate based polymers, methacrylate based polymers, cycloolefin based polymers, and novalacs.

Polymeric binders having cyclic structure(s) within the polymer backbone have the general formula

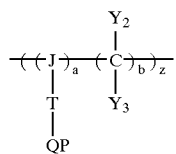

where J is a cyclic or bicyclic group and where $Y_2$ and $Y_3$, if present, are each independently hydrogen atoms, alkyl groups, e.g., methyl groups, electron withdrawing groups, e.g., halogen atoms, or K, and a is a positive value from 1 to 100, inclusive, b is a value from 0 to 100, inclusive, and z is a positive value from 2 to 100,000 inclusive. Q is a carboxylic acid, a carbonate or a hydroxyl group P is a protecting group for a carboxylic acid, e.g., an ester, a carbonate, or a hydroxyl group and T is a covalent bond or a bridging group having the formula:

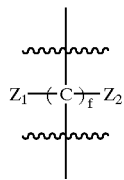

wherein $Z_1$ and $Z_1$ are each independently a hydrogen atom, an alkyl group, or an electron withdrawing group and f is a value from 0 to 6. It is understood that there can be more than one T per cyclic or bicyclic group.

The term "alkyl group" is art recognized and is intended to include hydrocarbon chains, generally having between about one and twenty carbon atoms, preferably, between one and five carbon atoms, e.g., a methyl group. The alkyl group can be substituted or unsubstituted, branched or unbranched and can include one or more degrees of unsaturation, e.g., an alkylene or an alkyne group. Suitable substituents include alkyl groups, aryl, esters, arnides, amines, carboxylic acid and electron withdrawing groups known in the art.

Suitable cyclic and bicyclic groups for J include, but are not limited to, cyclohexyl groups, cyclopentyl, cycloheptyl, and norbornyl. Therefore, suitable monomers include those which include at least one degree of unsaturation within the cyclic or bicyclic structure such that polymerization can occur between reactive monomers.

In addition to the hydroxyl protected polymer and photoacid generator, small molecules which help to inhibit hydrolysis of the protected hydroxyl groups can be included in the compositions of the invention. These small molecules are typically ester, ether, ketal or acetal protected low molecular weight polyhydridic alcohols or low molecular weight alcohols. The protecting groups can further include those listed below. Suitable low molecular weight hydrolysis inhibitors include, for example, Di-Boc Bisphenol A, Di-Boc o-cresolphthalein, tert-butyl lithocholate and tert-butyl deoxycholate (available from Midori Kagaku Col, Ltd. Tokyo, Japan).

Many film forming binders currently available are phenolic resins. For example, most positive acting photoresists currently in commercial applications are based on novolak resin and a naphthoquinone diazide sulfonic acid ester photoactive compound where the novolak resin is the reaction product of formaldehyde and a phenol. Examples of such photoresists are disclosed in U.S. Pat. Nos. 4,377,631 and 4,404,272, both incorporated herein by reference. Another class of positive acting photoresists include poly (vinylphenol) and a naphthoquinone diazide acid ester. Suitable examples of these photoresists are disclosed in U.S. Pat. Nos. 3,869,292 and 4,439,516, both incorporated therein by reference.

Phenol-based polymers useful for these acid-generating compositions are known and typically include novolak and poly(vinylphenol) resins and copolymers of the same with styrene and/or alpha-methylstyrene. Novolak resins are thermoplastic condensation products of a phenol, a naphthol or a substituted phenol, such as, cresol, xylenol, ethylphenol, butylphenol, isopropyl methoxyphenol, chlorophenol, bromophenol, resorinol, naphthol, chloronaphthol, bromonaphthol or hydroquinone with formaldehyde, acetaldehyde, benzaldehyde, furfural acrolein, or the like. Suitable examples of novolak resins are disclosed in U.S. Pat. Nos. 3,148,983; 4,404,357; 4,115,128; 4,377,631; 4,423,138; and 4,424,315, the disclosures of which are incorporated herein by reference.

Another phenol-based resin for the radiation sensitive compositions of the invention are copolymers of phenols and nonaromatic cyclic alcohols analogous in structure to the novolak resins and the poly(vinylphenol) resins. Such copolymers provide radiation sensitive compositions with relatively greater transparency to activating radiation. These copolymers may be formed in several ways. For exarnple, in the conventional preparation of a poly(vinylphenol) resin, a cyclic alcohol may be added to the reaction mixture during the polymerization reaction which is thereafter carried out in normal manner. The cyclic alcohol is preferably aliphatic, but may contain one or two double bonds. The cyclic alcohol is preferably one closest in structure to phenol. For example, if the resin is poly(vinylphenol), the comonomer would be vinyl cyclohexanol.

Poly(vinylphenol) resins are thermoplastic polymers that may be formed by block polymerization, emulsion polymerization or solution polymerization of the corresponding monomers in the presence of a cationic catalyst. Vinylphenols useful for the production of poly(vinylphenol) resins can be prepared, for example, by hydrolysis of commercially available coumarin or substituted coumarins, followed by decarboxylation of the resulting hydroxy cinnamic acids. Useful vinylphenols can also be prepared by dehydration of the corresponding hydroxy alkyl phenols or by decarboxylation of hydroxy cinnamic acids resulting from the reaction of substituted or non-substituted hydroxybenzaldehydes with malonic acid. Alternatively, polyvinyl phenol resins can be prepared by the direct polymerization of vinylphenol or by polymerizing acetoxy blocked vinyl phenol.

Other resins suitable for the practice of the invention include polymers made from polystyrene maleimides with pendant acid labile functionalities. Examples of useful polymers include those disclosed in U.S. Pat. Nos. 4,931,379, and 4,939,070, both of which are incorporated herein by reference. Vinylic polymers containing recurrent pendant group are also useful and are disclosed in U.S. Pat. No. 4,491,628, incorporated herein by reference.

Another suitable resin is polyglutarimides, prepared according to U.S. Pat. No. 4,246,374, incorporated herein by reference which are soluble in aqueous base and contain at least 40 weight percent of the nitrogen atoms of the NH or ammonia form.

Yet other suitable resin binders for use in accordance with the invention are phenol-based polymers that are partially silylated. For example, a silylated polymer is disclosed in U.S. Pat. No. 4,791,171, the contents of which are incorporated herein by reference. This patent discloses partially silylated poly(vinylphenol) polymers prepared by derivatizing the phenolic hydroxide moieties of a poly(vinylphenol) with suitable organosilicon compounds. Such derivatization can be accomplished, for example, by condensation of a poly(vinylphenol) with an organosilicon compound that has a suitable leaving group, for example trimethylsilylmethylchloride, bromide, mesylate or tosylate; trimethylsilylchloride, bromide, cyanide or mesylate; phenyldimethylsilylchloride; or t-butyldimethylsilylchloride.

Generally, the alkali-soluble resin containing phenolic hydroxyl groups useful in the present invention can be copolymers of o-, m-, or p-hydroxystyrene or o-, m-, or p-hydroxy-alpha-methylstyrene in which the content of the styrene derivative, for example, can be at least 30 mol %, preferably at least 50 mol %, a homopolymer of any of these styrene derivatives, or a partially hydrogenated resin derived from the copolymer or homopolymer. More preferred is a homopolymer of p-hydroxystyrene. Preferred examples of comonomers usable for the above copolymer include acrylic esters, methacrylic esters, acrylamide and analogues thereof, methacrylamide and analogues thereof, acrylonitrile, methacrylonitrile, maleic anhydride, styrene, alpha-methylstyrene, acetoxystyrene, and alkoxystyrenes. More preferred are styrene, acetoxystyrene, and t-butoxystyrene.

In one aspect of the invention, the non-amplied resist materials design strategy of the invention focuses on incorporating a DNQ moiety into the organic dispersant, i.e., a resin binder. This can be implemented by either direct attachment onto the inorganic nano-particle or by direct attachment onto a surface absorbed dispersant. For direct attachment on the inorganic nano-particle, a series of bi-functional organic reagents can be prepared. These reagents have the DNQ moiety attached to one end of hydrocarbon based chain and an electrophilic group capable of nucleophilic substitution at the other end. Attachment can be by the surface silanol undergoing nucleophilic substitution of or addition to the electrophilic group. Key to the design of this reagent is the length and polarity of the hydrocarbon based chain as this chain provides the solvation necessary to give organic solvent dispersion stability. Suitable electrophile groups are halogens, sulfonic acid esters, and acid halides, all capable of undergoing facial substitution by organic nucleophiles. A second method of attachment is to employ a silicon based coupling agent with a DNQ attached via a hydrocarbon based chain. Silicon coupling agents have found widespread use in the surface modification of silanol (silicon dioxide partially hydrolyzed) containing surfaces. An example is the wide spread use of HMDS to act as an adhesion agent for resist on silicon dioxide surfaces in microfrabrication. The required amount of DNQ attached to the nano-particle and the length and type of the hydrocarbon based chain can be determined by a combination of chemical and physical testing of the dispersants and evaluation of the lithographic performance of the system which can be determined by a person of ordinary skill in the art.

Incorporation of the DNQ moiety onto the organic dispersant can be accomplished by either modification of existing dispersants or the preparation of a special purpose photo-labile dispersant, Dispersants are a mixture of polar groups capable of surface absorption and non-polar groups whose function is to provide for solubility in the system solvent. Direct attachment of the readily available DNQ sulfonyl chloride (both 4 and 5 ring substituted) to the dispersants existing polar functionality represents one method to prepare a DNQ containing dispersant. This attachment can either encompass complete or partial polar group substitution. It is also possible to attach aliphatic diazoquinones instead of aromatic diazoquinones and have a system with lowered DUV absorbance. The preparation of special purpose photolabile dispersants offers an increased flexibility in designing the right mix of dispersing and lithographic properties into the molecule. This can be accomplished by incorporating a DNQ containing monomer into the dispersant polymer. Depending on polymerization conditions this can be accomplished by through the preparation of a random, block, or graft polymer. Random polymers have the DNQ monomer roughly equally spaced through the dispersant in a random fashion. Block and graft polymers segregate the DNQ monomer into specific segments of the dispersant polymer, either as a block of DNQ monomers in the main polymer backbone or as a separate polymer chain grafted onto the main polymer backbone. Block and graft type dispersants have been shown to lead to the particularly stable dispersion system, although dispersants based on random polymers are also widely used in industry. All three types of DNQ incorporation can be prepared to offer lithographic performance.

Non-amplified resists have traditionally been two component systems: a base polymer and a DNQ substituted polyhydroxyl inhibitors. In this approach, the DNQ inhibitor blocks dissolution of the normally base soluble polymer. In one embodiment, the inhibitor is attached onto the polymer leading to a one component resist. In the non-exposed state, the system is insoluble in TMAH (tetrarnethylamrnonium hydroxide) based developers due to no acidic protons available to promote base solubility. In the exposed state, the indene carboxylic imparts base solubility to the system and allow for TMAH developers to yield microimaging. The initial imaging can be accomplished on conventional 455 nm (g-line), 405 nm (h-line), or 365 nm (i-line) steppers due to the adsorbance of the DNQ moiety at this wavelength. An interesting note is that the use of an aliphatic allows imaging with either 248 or 193 nm due to decreased resist absorbance. The resist is sensitive to advanced imaging sources such as 157 nm, EUV, e-beam, x-ray, ion beam, and other sub-200 nm wavelengths.

In another aspect of the invention, the amplified resist materials design strategy focuses on incorporating acid labile groups into the organic dispersant. These groups are either acetals, ketals, esters, e.g., t-butyl esters, or carbonates, e.g., t-butyl carbonates, which lead to a positive tone resist or hydroxyls, which leads to a negative tone resist. This can be implemented by either direct attachment onto the inorganic nano-particle or by direct attachment onto a surface absorbed dispersant. For direct attachment on the inorganic nano-particle, a series of bi-functional organic reagents can be prepared. These reagents have the acid labile moiety attached to one end of hydrocarbon based chain and an electrophilic group capable of nucleophilic substitution at the other end. Attachment is to the surface silanol undergoing nucleophilic substitution of or addition to the electrophilic group. Electrophiles employed are equivalent to those described in the above DNQ attachment discussion presented above. A second method of attachment is to employ a silicon based coupling agent with a acid labile moiety attached via a hydrocarbon based chain. This is again similar to that described above. A third method is to employ either a nucleophilic substitution reaction or silicon coupling agent to attach a vinyl substituent to the nano-particle. This vinyl substituent can then be co-polymerized with a variety of vinyl containing monomers to build the required dispersant and lithographic functionality into the encapsulant. This method offers exceptional versatility for incorporate acetals, t-butyl esters, and alcohols into the organic encapsulant via the wide range of existing monomers employed in the preparation of conventional organic resist polymers as well as allowing for incorporation of a third monomer to modify either dispersant or lithographic functionality. The required amount of acid labile moiety attached to the nano-particle and the length and type of the hydrocarbon based chain can be determined by a combination of chemical and physical testing of the dispersants and evaluation of the lithographic performance of the system.

Incorporation of the acid labile moiety onto the organic dispersant, i.e., the resin, can be accomplished by either modification of existing dispersants or the preparation of a special purpose photo-labile dispersant. Dispersants are a mixture of polar groups capable of surface absorption and non-polar groups whose function is to provide for solubility in the system solvent. Direct attachment of the series of bi-functional organic reagents described above for direct attachment to nano-particles can also be used reactant with the nucleophilic polar functionality of the dispersant. The reagent, having the acid labile moiety attached to one end of hydrocarbon based chain and an electrophilic group capable of nucleophilic substitution at the other end, can be used to effect either complete or partial polar group substitution, the exact amount requiring experimental determination. The preparation of special purpose photo-labile dispersants offers an increased flexibility in designing the right maix of dispersing and lithographic properties into the, molecule. This can be accomplished by incorporating the acid labile moiety containing monomer into the dispersant polymer. Depending on polymerization conditions this can be accomplished through the preparation of a random, block, or graft polymer. Using three different types of polymerization to yield random, block, or graft polymers with either t-butyl ester, acetal, or hydroxyl chemical functionality leads to nine distinct classes of lithographically functionalized dispersants.

It should also be understood, and is well known by those skilled in the art, that most of the formulations suitable for use in this invention contain a small amount of base plo which may help to stabilize the polymer system. In general, less than 1% is a base component, based on the total weight of the polymer composition, e.g., less than 0.5%. Suitable bases typically are organic bases known in the art such as tetrabutylammonium hydroxide, diazabicyclo[5.4.0]undec-7-ene, diphenyl amine, trioctyl amine, or triheptal amine.

Positive amplified resists have traditionally been either a two or three component system: a base copolymer containing base soluble and acid-labile functionality, a photoacid generator (PAG), and optionally a small molecule also containing acid-labile functionality. The photogenerated acid catalytically removes the acid-labile blocking groups to reveal additional base solubility functionality leading to dissolution of the polymer.

The term "photo-acid generator" (PAG) is recognized in the art and is intended to include those compounds which generate acid in response to radiant energy. Preferred photoacid generators for use in the present invention are those that are reactive to radiant energy having a wavelength equal to or less than 455 nm. More specifically, the PAG should respond to energies at one or more wavelengths or energies such as 248 nm, 193 nm, 157 nm, e-beam (high or low voltage e-beam), x-rays, EUV and/or ion beam. The photo-acid generator should be soluble in the polymer resin or solublized in an organic solvent. Preferably, the solution of the photo-acid generator and polymer in the organic solvent are suitable for spin coating. The photo-acid generator can include a plurality of photo-acid generators. The photo-acid generator is included in the composition at levels between about 0.01% and about 50%, more preferably between about 0.5% and about 20%, and most preferably between about 1.0% and about 10%, based on the total weight of the photoresist composition.

Suitable photo-acid generators include onium salts, such as triphenylsulfonium salts, sulfonium salts, iodonium salts, diazonium salts and ammonium salts, 2,6-nitrobenzylesters, 1,2,3-tri(methanesulfonyloxy)benzene, sulfosuccinimides and photosensitive organic halogen compounds as disclosed in Japanese Examined Patent Publication No. 23574/1979.

Examples of diphenyliodonium salts include diphenyliodonium triflate (DPI-105, Midori Kagaku Co. Ltd.) and diphenyliodonium tosylate (DPI-201, Midori Kagaku Co. Ltd.). Examples of suitable bis(4-tert-butylphenyl)iodonium salts include bis(4-tert-butylphenyl)iodonium triflate (BBI-105, Midori Kagaku Co. Ltd.), bis(4-tert-butylphenyl) iodonium camphorsulfate (BBI-106, Midori Kagaku Co. Ltd.), bis(4-tert-butylphenyl)iodonium perfluorbutylate (BBI-109, Midori Kagaku Co. Ltd.) and bis(4-tert-butylphenyl)iodonium tosylate (BBI-201, Midori Kagaku Co. Ltd.). Suitable examples of triphenylsulfonium salts include triphenylsulfonium hexafluorophosphite (TPS-102, Midori Kagaku Co. Ltd.), triphenylsulfonium triflate (TPS-105, Midori Kagaku Co. Ltd.) and triphenylsulfonium perfluorobutylate (TPS-109, Midori Kagaku Co. Ltd.).

Specific examples of the photosensitive organic halogen compound include halogen-substituted paraffinic hydrocarbons such as carbon tetrabromide, iodoform, 1,2,3,4-tetrabromobutane and 1,1,2,2-tetrabromoethane; halogen-substituted cycloparaffuiic hydrocarbons such as hexabromocyclohexane, hexachlorocyclohexane and hexabromocyclododecane; halogen-containing s-triazines such as tris(trichloromethyl)-s-triazine, tris (tribromomethyl)-s-triazine, tris(dibromomethyl)-s-triazine and 2,4-bis(tribromomethyl)-6-methoxyphenyl-s-triazine; halogen-containing benzenes such as (bis(trichloromethyl) benzene and bis(tribromomethyl)benzene; halogen-containing sulfone compounds such as tribromomethylphenylsulfone, trichloromethylphenylsulfone and 2,3-dibromosulforane; and halogen-substituted isocyanurates such as tris(2,3-dibromopropyl)isocyanurate. Among such photosensitive organic halogen compounds, a bromine-containing compound is particularly preferred.

The term "acid labile moiety" is well recognized in the art and is intended include those groups which are resistant basic solutions but are removed under acidic conditions. For example, the hydroxyl groups of the polymer of the invention can be protected by chemical reactions by using protecting groups which render the reactive hydroxyl groups substantially inert to the reaction conditions. (See for example, Protective Groups in Organic Synthesis, 2 ed., T. W. Green and P. G. Wuts, John Wiley & Sons, New York, N.Y. 1991). Thus, for example, protecting groups such as the following may be utilized to protect hydroxyl groups: acetals, ketals, esters, e.g., t-butyl esters, t-butyl carbonates, and ethers known in the art; trialkyl silyl groups, such as trimethylsilyl and t-butyldimethylsilyl (TBDMS); and groups such as trityl, tetrahydropyranyl, vinyloxycarbonyl, o-nitrophenylsulfenyl, diphenylphosphinyl, p-toluenesulfonyl, and benzyl, may all be utilized. Additionally, $CH_3OCH_2Cl$, $(CH_3)_3SiCH_2CH_2OCH_2Cl$, $CH_3OCH_2CH_2OCH_2Cl$, $ClCO_2$-t-butyl, methyl dihydropyran, methyl dihydrofuran, tetrabutylvinylether, .2-methoxypropene, isobutylvinylether and ethylvinylether are useful as protecting groups. (See for example, C. Mertesdor et al. Microelectronics Technology, 1995, pg. 35–55.) Similar protecting groups and their removal are known for protection of carboxylic acids and carbonates.

The protecting group may be removed, after completion of the synthetic reaction of interest, by procedures known to those skilled in the art. For example, acetal and ketal groups may be removed by acidolysis, the trityl group by hydrogenolysis, TBDMS by treatment with fluoride ions, and TCEC by treatment with zinc. One skilled in the art will appreciate that the choice of a hydroxyl protecting group(s) is tailored to the specific application and conditions to which the protected hydroxyl group must withstand. Ultimately, the generation of acid from the photo-acid will cleave the oxygen bond to the protecting group to regenerate a free hydroxyl group. Similarly, carbonates and esters can also be deprotected by methods known in the art.

It should be understood that not all hydroxyl groups, for example, need to be protected, that is, the hydroxyl groups within the polymer matrix can be partially protected. In general, it is considered advantageous to have at least 10% of the hydroxyl groups protected in a hydroxyl containing homopolymer. Preferably, between about 15% and about 50% of the hydroxyl groups are protected in the homopolymer.

Copolymers that contain unprotected hydroxyl groups are useful in the present invention. In one embodiment, at least 10% of the hydroxyl groups are protected. In another embodiment, at least 15% of the hydroxyl groups are protected. Again, preferably, between about 15% and about 50% of the hydroxyl groups are protected.

In addition to the hydroxyl protected polymer, or ester or carbonate, for example, and photo-acid generator, small molecules which help to inhibit hydrolysis of the protected hydroxyl groups can be included in the compositions of the invention. These small molecules are typically ester,; ether, ketal or acetal protected low molecular weight polyhydridic alcohols or low molecular weight alcohols. The protecting groups can further include those listed previously. Suitable low molecular weight hydrolysis inhibitors include, for example, Di-Boc Bisphenol A, Di-Boc o-cresolphthalein, tert-butyl lithocholate and tert-butyl deoxycholate (available from Midori Kagaku Col, Ltd. Tokyo, Japan).

Negative amplified resists traditionally have been three component systems, a base soluble polymer, a photoacid generator, and an acid-labile crosslinker. The photogenerated acid catalyzes a reaction in which the crosslinker adds to the polymer and through a combination of site blocking and molecular weight gain inhibits dissolution of the polymer. Negative resists include epoxides and melamine resins known in the art.

The photosensitive compositions of the present invention can be used by dissolving the components, e.g., the resin, the encapsulated inorganic material, optionally a PAG and optionally, a low molecular weight protected alcohol, in a solvent. The solvent is not particularly limited, so long as it is a solvent capable of presenting adequate solubility to the resin, encapsulated inorganic material and additional components and capable of providing good coating properties. For example, it may be a cellosolve type solvent such as methyl cellosolve, ethyl cellosolve, methyl cellosolve acetate or ethyl cellosolve acetate. Ethylene glycol based solvents such as ethylene glycol monomethyl ether, diethylene glycol monomethyl ether, diethylene glycol dibutyl ether, diethylene glycol and diethylene glycol dimethyl ether are suitable as organic solvents for the photosensitive compositions of the invention. Propylene glycol based solvents such as propylene glycol monoethyl ether, propylene glycol monobutyl ether, propylene glycol monomethyl ether acetate, dipropylene glycol dimethyl ether or propylene glycol monoethyl ether acetate can be used. Suitable ester type solvents include butyl acetate, amyl acetate, ethyl butyrate, butyl butyrate, diethyl oxalate, ethyl pyruvate, ethyl-2-hydroxybutyrate, 2-methyl-acetoacetate, methyl lactate or ethyl lactate. Alternatively, alcohols are utilized and include heptanol, hexanol, nonanol, diacetone alcohol or furfuryl alcohol. Examples of suitable ketone solvents include cyclohexanone or methylamyl ketone. Ethers useful as solvating agents include methyl phenyl ether or diethylene glycol dimethyl ether. Polar solvents, such as dimethylformamide or N-methylpyrrolidone can also be used. The solvents can be used alone or as combinations of two or more solvents.

Typically the solvent is used in an amount of from 1 to 100 times by weight, e.g., 3 to 20 times by weight, relative to the total amount of the solid content of the photosensitive composition.

Further, the photosensitive composition of the present invention may contain various additives such as a surfactant, a coating property-improving agent, a stabilizer, a colorant and an ultraviolet absorber, to such an extent not to impair the desired properties.

Suitable surfactants which can be added to the photosensitive composition to improve coating ability include nonionic surfactants including polyoxyethylene alkyl ethers such as polyoxyethylene lauryl ether, polyoxyethylene stearyl ether and polyoxyethylene oleyl ether, polyoxyethylene alkylphenyl ethers such as polyoxyethylene octylphenyl ether and polyoxyethylene nonylphenyl ethers. Suitable nonionic ester surfactants include polyethylene glycol dialkyl esters such as polyethylene glycol dilaurate and polyethylene glycol distearate. Alternatively, fluorine-containing surfactants can be utilized which contain a fluoroalkyl or perfluoroalkyl group such as Efftop EF301, EF303 and EF352 (manufactured by Shinakitakasei Co., Ltd.), Megafac F171, F172 and F173 (manufactured by Dainippon Ink Co., Ltd.), Asahiguard AG710 (manufactured by Asahi Glass Co., Ltd.), Florade FC430 and FC431 (manufactured by Sumitomo 3M Co., Ltd.), and Surflone S-382, SC101, SC102, SC103, SC104, SC105 and SC106 (manufactured by Asahi Glass Co., Ltd.). Organosiloxane surfactants, such as organosiloxane polymer KP341 (manufactured by Shinetsu Kagaku Kogyo Co., Ltd.) are also suitable for decreasing the surface tension of the solution containing the photosensitive composition. Additionally, acrylic acid- or methacrylic acid-type polymers and copolymers such as Polyflow No. 75, No. 95 and WS (manufactured by Kyoeisha Yushikagaku Kogyo Co., Ltd.); and the like are also suitable surfactants. The amount of the surfactant to be added is usually less than 2 parts by weight, preferably 0.005–1 part by weight, per 100 parts by weight of the abovementioned condensate.

Furthermore, antioxidants or defoaming agents can be compounded as required to attenuate the radiation-sensitive composition of this invention.

The positive tone resist of the invention are, generally, two component, the encapsulated nano-particle containing acid-labile functionality and a PAG. Photogenerated acid transforms the nano-particle from base insoluble to base soluble by unmasking acid functionality on the polymer and thus allow for TMAH based development. In a like manor, negative resists are based on current negative resist design strategy employing a base soluble nano-particle which can be transformed via photogenerated acid to base insolubility. Initial imaging can be accomplished on conventional 248 mn steppers due to the adsorbance of the many PAGs at this wavelength. An interesting note is that the use of an aliphatic blocking groups and PAGs allows imaging at the 193 nm due to decreased resist absorbance. The resist is also sensitive to advanced sources such as 157 nm, EUV, e-beam, x-ray, ion beam, and other sub-200 nm wavelenghts.

In a preferred embodiment, a common denominator of all of the above described systems is that the inorganic core is composed of $SiO_2$ with a SiOH rich surface and that materials can have a very high silicon content. The silicon acts as a hard mask for further plasma processing steps and allows the use of aspect limited lithography in the sub-100-nm resolution range with 100–300 nm thick resists. Silicon is a hard etch mask since it is relatively well known and accepted in the semiconductor industry. However, the same concept is also applicable to other inorganic materials with more refractory qualities. Dispersions of both $Al_2O_3$, and $TiO_2$ having nano-particle scale dimensions are known and either of these metal oxides can be employed as the inorganic core.

A special feature of all of the encapsulated inorganic resists is the very low resist absorbance at optical wavelengths. The encapsulated inorganic resists have an inorganic core composed of optically transparent metal oxides such as $SiO_2$, $Al_2O_3$, and $TiO_2$ which account for over 50% of the weight of the resist. This could necessitate the need for ARCs (antireflective compositions) to reduce internal reflections and the resulting standing waves produced in the resist, although the ultra-transparency of the resist should lead to imaging superior to any conventional resist if all factors other then adsorbance were held constant. Also, due to the ultra-transparency at some optical wavelengths, the use of traditional resist dye may be necessary as an additional component of the resist.

Transferring imaged patterns via plasma etch requires that a sufficient resist be present to act as an etch mask, but traditional polymer based single layer resists appear to be limited by an aspect ratio of 3:1. As critical features approach 25 nm, resist thickness is expected to drop to under 100 nm, a thickness that does not allow plasma image transfer without a many fold improvement in plasma etch selectivity. The encapsulated inorganic resist has, due to its silicon based core, plasma etch selectivity necessary for image transfer even at 100 nm thickness. These resist systems act as a single layer hard mask although use as the top layer in a bi-layer resist scheme is certainly possible.

Resists must maintain critical linewidth control throughout the patterning process, including both imaging and subsequent transfer via plasma etch. Line-edge roughness on the order of 5–10 nm is a concern at 250 nm, but renders a lithographic process unworkable when critical dimensions fall to below 100 nm. The encapsulated inorganic species of the invention, e.g., silica ($SiO_2$), can be prepared in 1–5 nm diameter particles, and is commercially available as 8 to 10 nm or 8 to 20 nm particles (C. Brinker and G. Schere, *Sol-Gel Science* (Academic Press, Boston, 1990) p. 97.). Silicon containing particles of this size offer the advantage of having a relatively small pixel size in terms of the smallest fundamental molecular unit that can be soluble or insoluble after development. This small pixel size will lead to decreased line-edge roughness in resists.

A further advantage of the invention is that the nanoparticles are organic solvent and base soluble. This feature makes the resist fully compatible with conventional resist processing and does not lead to insoluble particles or residues due to the incorporation of nanoparticles. The nanoparticles remain soluble in the resist solvent as both nanoparticles and as the polymer encapsulated species. The nanopartilces also remain base soluble in developer as both nanoparticles, and as the polymer encapsulated species including when the polymer is transformed into a highly base soluble polymer.

After coating onto a suitable substrate, the solvent, if present, will usually be removed from the photosensitive resist composition of the invention, which includes a resin binder and a encapsulated inorganic material, by drying, conveniently in the temperature range from 70° to 160° C.

The resist film is a photopolymer/encapsulated inorganic material composition which, after drying, has high photosensitivity, is not subject to autocatalytic decomposition, and has very good adhesion to the substrate. Furthermore, the resist film has high transparency and sensitivity, even in the wavelength range of 157 nm, and has good thermal stability.

To produce relief structures, the substrate, e.g., a silicon wafer, is coated with the formulation of the present invention and is then exposed. The expression "exposure" will be understood as meaning not only exposure through a photomask that contains a predetermined pattern, for example a photographic transparency, but also exposure with a laser beam that is moved by computer control over the surface of the coated substrate to produce an image, irradiation with computer-controlled electron beams, or projection e-beam, as well as exposure with X-ray or UV radiation through an appropriate mask.

Exposure is normally carried out with UV radiation, preferably in the wavelength range from about 130 to 400 nm, more particularly from 150 to 200 nm and, most preferably between about 157 and 193 nm or with electron beam (high or low energy). Various known sources of radiation can be used for exposure, typically including mercury high-pressure lamps and UV lasers and, preferably, excimer lasers. The process parameters such as exposure time and distance from the radiation source and radiation-sensitive layer will usually depend on the type of radiation-sensitive formulation and on the desired properties of the coating, and can be determined by the person skilled in the art by routine experimentation.

After exposure, the wafer can be heated or baked at about 50° to about 160° C. for a few seconds to a few minutes. Subsequently, the exposed areas of the photoresist are washed out with a developer. The choice of developer will depend on the type of photoresist, in particular on the nature of the binder employed or of the resultant photolysis products. The developer may comprise aqueous solutions of bases to which organic solvents or mixtures thereof may be added.

The novel formulations are preferably used as positive photoresists. A further object of the invention is therefore a process for the production of relief structures, which process comprises the following process steps in the indicated sequence:

Applying a layer consisting of a formulation as described above to a substrate;

Exposing of the coating with radiation; and

Treating the coating with a developer consisting of an aqueous alkaline solution until the areas subjected to radiation are removed.

Particularly preferred developers are the aqueous alkaline solutions that typically include solutions of alkali metal silicates, alkali metal phosphates, alkali metal hydroxides and alkali metal carbonates, but preferably tetraalkylammonium hydroxide solutions such as tetramethylammonium hydroxide solution. To these solutions may be added minor amounts of wetting agents and/or organic solvents. Typical organic solvents that may be added to the developer fluids include cyclohexanone, 2-ethoxyethanol, toluene, acetone, isopropanol, ethanol, as well as mixtures of two or more of these solvents.

The application of the developer is preferably effected by immersing the coated and imagewise exposed substrate in the developer solution, by spraying the developer solution on to the substrate, or by repeatedly applying and spin-coating the developer on to the coated and imagewise exposed substrate.

With the photosensitive compositions of the present invention, it is possible to obtain a pattern profile of high resolution by exposure with a light having a wavelength in the deep UV region. Accordingly, the compositions are extremely useful as photoresists, particularly for the production of very large scale integrated circuits.

The following examples serve to further describe the invention.

EXAMPLE 1

Preparation of Positive Acid Catalyzed Resists

A stock solution 18% by weight silicon dioxide ($SiO_2$) nanoparticles (10 to 20 nm diameter) was prepared by adding 120 gr MIBK-ST from Nisson Chemical (30% by weight $SiO_2$ in methyl isobutyl ketone) and 80 grams by weight of ethyl lactate. No precipitation was observed after 24 hours. Four solutions, as described in Table 1, were prepared by adding the stock solution of $SiO_2$ to UV5 photoresist from Shipley Company. (UV5 is a terpolymer available from Shipley Company having the general formula of polyvinylphenol, t-butyl acrylate and styrene and contains di-tert-butyl iodonium camphorsulphonate as the PAG). No precipitation was observed after 24 hours. UV5 photoresist at 18% by weight solids and the stock solution of 18% $SiO_2$ were employed as comparative examples in comparison 1 through 5. UV5, a commercial resist used in high resolution DUV, x-ray, and e-beam imaging, was employed to provide a comparison between the nanoparticle containing resists and a commercial resist employed in advanced integrated circuit manufacturing.

TABLE 1

Composition of Resists 1 through 6.

| Name | Weight Percent $SiO_2$ (as total solids) | Weight Percent MIBK-ST (as total weight) | Weight UV5 (as total weight) |
|---|---|---|---|
| Resist 1 | 0% | 0% | 100% |
| Resist 2 | 10% | 10% | 90% |
| Resist 3 | 20% | 20% | 80% |
| Resist 4 | 33% | 33% | 67% |
| Resist 5 | 50% | 50% | 50% |
| Resist 6 | 100% | 100% | 0% |

This shows that the nanoparticles are soluble in a typical resist solvent.

COMPARISON 1

Base Dissolution Rates of Positive Acid Catalyzed Resists

The base dissolution rate of the resists was determined by spin casting a resist film on a 4 inch silicon wafer followed by hot plate baking for at 130 C for 60 seconds. The resist thickness was determined and is shown in Table 2. The resist film was then placed in a base developer, TOK NMD-3 (2.38% tetramethyl ammonium hydroxide), for 60, 120, 180, or 300 seconds, rinsed with DI water, and remaining film thickness was measured. The resist dissolution rate was determined by the slope of a straight line fit of resist thickness versus development time. The resist thickness remaining and the calculated dissolution rate are presented in Table 2.

TABLE 2

Base dissolution rates of Resists 1 through 6.

| Name | Thickness Initial | Thickness 60 Seconds | Thickness 120 Seconds | Thickness 180 Seconds | Thickness 300 Seconds | Dissolution Rate |
|---|---|---|---|---|---|---|
| Resist 1 | 782 nm | 756 nm | 740 nm | 732 nm | 693 nm | 0.28 nm/s |
| Resist 2 | 900 nm | 883 nm | 885 nm | 846 nm | 860 nm | 0.15 nm/s |
| Resist 3 | 810 nm | 717 nm | 709 nm | 720 nm | 718 nm | 0.22 nm/s |
| Resist 4 | 740 nm | 684 nm | 634 nm | 646 nm | 632 nm | 0.32 nm/s |
| Resist 5 | 630 nm | 543 nm | 533 nm | 530 nm | 477 nm | 0.53 nm/s |
| Resist 6 | 597 nm | 0 nm | 0 nm | 0 nm | 0 nm | >10.0 nm/s |

The data demonstrates that Resist 6, the 100% $SiO_2$ nanoparticle film, has a much higher dissolution rate then all of the other 5 resists. This dissolution rate was to too high to retain any imaged features in the unexposed area of the resist. The remaining 5 resists all have similar dissolution rates and retained sufficient film thickness to image features in the unexposed area of the film. These 5 resists also retained sufficient resist thickness to protect the under lying substrate from further processing steps in integrated circuit fabrication. It is surprising and unexpected that even up to 50% $SiO_2$ nanoparticle incorporation in the film, the dissolution rate in base in similar to that of the control resist which contains 0% $SiO_2$. This also demonstrates that the nanopartilces are highly soluble in base developer typical of that used in the fabrication of integrated circuits.

COMPARISON 2

Bulk Lithographic Properties of Positive Acid Catalyzed Resists

The bulk lithographic properties of the resists were determined by spin casting a resist film too approximately 600 nm on a 4 inch silicon wafer followed by hot plate baking at 130 C for 60 seconds. The resist was exposed by 50 kV electron beam on a JOEL JBX-5DII with a bulk exposure pattern consisting of a series of 300 by 300 Am pads with the exposure dose ranging from 4.0 to 11.0 $\mu C/cm^2$ in steps of 0.5 $\mu C/cm^2$. After exposure the resist was baked on a hot plate at 130 C for 90 seconds. The resist film was then placed in a base developer, TOK NMD-3 (2.38% tetramethyl ammonium hydroxide), for 60 seconds, rinsed with DI water, and remaining film thickness was measured. The dose to clear is a measure of the sensitivity of a resist and was determined by calculating the slope of a straight line fit of the normalized resist thickness between 0% and 80% of initial resist thickness and exposure dose and determining the exposure dose which would lead to 0% of the initial resist thickness remaining. The resist contrasts a measure of the lithographic potential of a resist and was determined by calculating the slope of a straight line fit of the normalized resist thickness between 0% and 80% of initial resist thickness and the log of the exposure dose. The resist thickness loss was determined by subtracting the initial resist film thickness from the film thickness of an unexpected area of the resist after development. The resist dose to clear, contrast, and film thickness loss are presented in Table 3.

TABLE 3

Bulk lithographic properties of Resists 1 through 5.

| Name | Dose to Clear | Contrast | Film Thickness Loss |
|---|---|---|---|
| Resist 1 | 8.6 $\mu C/cm^2$ | 28.8 | 35 nm |
| Resist 2 | 9.0 $\mu C/cm^2$ | 23.4 | 187 nm |
| Resist 3 | 9.0 $\mu C/cm^2$ | 33.7 | 33 nm |
| Resist 4 | 9.0 $\mu C/cm^2$ | 30.6 | 59 nm |
| Resist 5 | 8.6 $\mu C/cm^2$ | 11.5 | 80 nm |

The data demonstrates that all resists have similar doses to clear which and as such all retain good sensitivity for electron beam exposure. The resists 1 through 4 all have similar resist contrast and as such have similar imaging characteristics. Resist 5 has a lower contract then resists 1 through 4, but a resist with a contrast of 5 or grater is expected to has good imaging characteristics. All resists have relatively low film thickness losses and as such retain sufficient resist thickness to protect the under lying substrate from further processing steps in integrated circuit fabrication. The bulk imaging results of the nanoparticle containing resists relative to UV5, a commercial resist used in high resolution e-beam imaging, demonstrates that nanoparticle containing resist have imaging characteristics similar to UV5 and that the incorporation of nanoparticles, does not degrade the resist imaging characteristics.

COMPARISON 3

Lithographic Imaging Properties of Positive Acid Catalvzed Resists

The imaging properties of the resists were determined by spin casting a resist film to approximately 600 nm on a 4 inch silicon wafer followed by hot plate baking for 130 or 135 C for 60 seconds. This bake is known as a post apply bake (PAB). The resist was exposed by 50 kV electron beam on a JOEL JBX-5DII with a resolution test pattern consisting of a series of equal distance line and spaces with fine widths ranging between 200 and 600 nm and a series of isolated lines with the spacewidth three times the linewidth. The test pattern was exposed with a series of exposure doses ranging from 15.0 to 22.0 $\mu C/cm^2$ in steps of 1.0 $\mu C/cm^2$. After exposure the resist was baked on a hot plate at 130 C for 60 seconds. This bake is known as a post exposure bake (PEB). The resist film was then placed in a base developer, TOK NMD-3 (2.38% tetramethyl ammonium hydroxide), for 60 seconds and rinsed with DI water. The dense resolution was determined by noting the smallest printed lines that had a linewidth that approximately equaled the nominal linewidth. The isolated resolution was determined by noting the smallest printed lines that maintained the linewidth that approximately equaled the nominal linewidth. The dose to size was determined by noting the exposure dose required to image resolution test pattern when the finewidth approximately equaled the spacewidth. The resist dose to size and resolution are presented in Table 4 along with the post apply bake (PAD) temperature.

TABLE 4

Lithographic imaging properties of Resists 1 through 6.

| Name | Dose to Size | Dense Resolution | Isolated Resolution | PAB Temperature |
|---|---|---|---|---|
| Resist 1 | 17 $\mu C/cm^2$ | 200 nm | 200 nm | 135 C. |
| Resist 3 | 17 $\mu C/cm^2$ | 200 nm | 200 nm | 135 C. |
| Resist 4 | 15 $\mu C/cm^2$ | 200 nm | 300 nm | 130 C. |
| Resist 5 | 15 $\mu C/cm^2$ | 500 nm | 500 nm | 130 C. |

The above data demonstrate that the nanoparticle resists 3, 4, and 5 are capable of high resolution imaging and that resists 3 and 4 have similar resolution characteristics to UV5. This result is surprising in that the resist process was not optimized and that with process optimization, improved resolution could be obtained. It is also noted that the dissolution rate data demonstrates that although high $SiO_2$ containing resists have similar dissolution rates to UV5 the rates are somewhat greater. It is expected that if a resist was employed with a dissolution rate lower then UV5 that a mixture of this resist with high levels of $SiO_2$ nanopanicles will give a resist with both dissolution rates lower and resolution characteristics similar or even greater than UV5.

COMPARISON 4

Oxygen Plasma Etch Properties of Positive Acid Catalvzed Resists

The oxygen plasma etch properties of the resists were determined by spin casting a resist film to approximately 1000 nm on a 4 inch silicon wafer followed by hot plate baking for at 130 C for 60 seconds. The resist was plasma etched in a single wafer Oxford Plasma Technologies plasma etcher in RIE mode for 1.0, 2.5, or 5.0 minutes. Etch conditions were an oxygen flow rate of 40 sccm, a pressure of 10 mTorr, applied power of 200 watts, and a DC bias of −460 volts. The thickness of the resist film was determined after plasma etch and the plasma etch depth calculated by subtracting the film thickness after etch from the initial film thickness. The plasma etch rate was determined by a straight fine fit of the plasma etch depth versus plasma etch time. The plasma etch rates of the resists are presented in Table 5 as are the etch rates normalized to Resist 1 (UV5).

TABLE 5

Oxygen plasma etch rates of Resists 1 through 6.

| Name | Etch Depth (1.0 nm) | Etch Depth (2.5 min) | Etch Depth (5.0 min) | Plasma Etch Rate | Normalized to Resist 1 |
|---|---|---|---|---|---|
| Resist 1 | 230 nm | 620 nm | 1000 nm | 188 nm/min | 1.00 |
| Resist 2 | 190 nm | 470 nm | 610 nm | 100 nm/min | 0.53 |
| Resist 3 | 73 nm | 230 nm | 285 nm | 50 nm/min | 0.27 |
| Resist 4 | 28 nm | 50 nm | 100 nm | 18 nm/min | 0.10 |
| Resist 5 | 8 nm | 52 nm | 45 nm | 9 nm/min | 0.05 |
| Resist 6 | 0 nm | 5 nm | 12 nm | 3 nm/min | 0.02 |

The above data demonstrates that the addition of $SiO_2$ nanoparticles, to a resist dramatically reduces the plasma etch rate. A reduced plasma etch rate is a major improvement to the resist technology. At 10% nanoparticles, a low level, the etch rate is reduced by half. At higher level of 20% and 33% where the lithographic imaging is comparable to UV5, the etch rate is reduced by up to a factor of ten. The resist containing 50% nanoparticles shows the greatest reduction in etch rate by a factor of twenty. These results are significant and show that the incorporation of $SiO_2$ nanoparticles into a resist leads to a dramatic improvement in the resist's ability to resist plasma etch.

COMPARISON 5

Chlorine Plasma Etch Properties of Positive Acid Catalyzed Resists

The chlorine plasma etch properties of the resists were determined by spin casting a resist film too approximately 1000 nm on a 4 inch silicon wafer followed by hot plate baking for at 130 C for 60 seconds. The resist was plasma etched in a single wafer Oxford Plasma Technologies plasma etcher in RIE (reactive ion etch) mode for 1.0, 2.5, or 5.0 minutes. Etch conditions were an oxygen flow rate of 20 sccm, a pressure of 10 mTorr, applied power of 150 watts, and a DC bias of −370 volts. The thickness of the resist film was determined after plasma etch and the plasma etch depth calculated by subtracting the film thickness after etch from the initial film thickness. The plasma etch rate was determined by a straight line fit of the plasma etch depth versus plasma etch time. The plasma etch rates of the resists are presented in Table 6 as are the etch rates normalized to Resist 1 (UV5).

TABLE 6

Chlorine plasma etch rates of Resists 1 through 6.

| Name | Etch Depth (1.0 nm) | Etch Depth (2.5 min) | Etch Depth (5.0 min) | Plasma Etch Rate | Normalized to Resist 1 |
|---|---|---|---|---|---|
| Resist 1 | 100 nm | 245 nm | 479 nm | 95 nm/min | 1.00 |
| Resist 2 | 62 nm | 190 nm | 318 nm | 63 nm/min | 0.65 |
| Resist 3 | 58 nm | 148 nm | 266 nm | 52 nm/min | 0.54 |
| Resist 4 | 40 nm | 85 nm | 205 nm | 42 nm/min | 0.44 |
| Resist 5 | 26 nm | 70 nm | 140 nm | 28 nm/min | 0.30 |
| Resist 6 | 15 nm | 42 nm | 95 nm | 20 nm/min | 0.21 |

The above data demonstrates that the addition of $SiO_2$ nanoparticles to a resist dramatically reduces the plasma etch rate. A reduced plasma etch rate is a major improvement to the resist technology. At 10% nanoparticles, a low level, the etch rate is reduced to two thirds that of UV5. At higher levels of 20% and 33% where the lithographic imaging is comparable to UV5, the etch rate is reduced by a factor of two to two and a half. The resist containing 50% nanoparticles shows the greatest reduction in etch rate by a factor of three. Chlorine based plasmas are among the most severe tests of a resist's ability to withstand a plasma etch. These results are significant and show that the incorporation of $SiO_2$ nanoparticles into a resist leads to a dramatic improvement in the resist's ability to resist plasma etch.

EXAMPLE 2

Preparation of Negative Acid Catalyzed Resists

A stock solution 10.5% by weight silicon dioxide ($SiO_2$) nanoparticles (10 to 20 mn diameter) was prepared by adding 100 grams IPA-ST from Nisson Chemical (30% by weight $SiO_2$ in isopropyl alcohol) and 185.7 gr by weight of ethyl lactate. No precipitation was observed after 24 hours. Three solutions, as described in Table 7, were prepared by adding the stock solution of $SiO_2$ to SAL603 photoresist from Shipley Company (hexamethoxy methylmelamine and tris-2,3-dibromopropyl isocyanurate). No precipitation was observed after 24 hours. SAL603 photoresist at 10.5% by weight solids and the stock solution of 10.5% $SiO_2$ were employed as comparative examples in comparison 6 through 10. SAL603, a commercial resist used in high resolution DUV, x-ray, and e-beam imaging, was employed to provide a comparison between the nanoparticle containing resists and a commercial resist employed in advanced integrated circuit manufacturing.

TABLE 7

Composition of Resists 7 through 11.

| Name | Weight Percent $SiO_2$ (as total solids) | Weight Percent IPA-ST (as total weight) | Weight SAL603 (as total weight) |
|---|---|---|---|
| Resist 7 | 0% | 0% | 100% |
| Resist 8 | 25% | 25% | 75% |
| Resist 9 | 50% | 50% | 50% |
| Resist 10 | 75% | 75% | 25% |
| Resist 11 | 100% | 100% | 0% |

This demonstrates that the nanoparticles are soluble in a typical resist solvent.

EXAMPLE 3

Preparation of Negative Acid Catalyzed Resists

A stock solution 10.5% by weight silicon dioxide ($SiO_2$) nanoparticles (8 to 10 nm diameter) was prepared by adding 100 grams IPA-ST-S from Nisson Chemical (30% by weight $SiO_2$ in isopropyl alcohol) and 185.7 gr by weight of ethyl lactate. No precipitation was observed after 24 hours. Three solutions, as described in Table 8, were prepared by adding the stock solution of $SiO_2$ to SAL603 photoresist from Shipley Company. No precipitation was observed after 24 hours. SAL603 photoresist at 10.5% by weight solids and the stock solution of 10.5% $SiO_2$ were employed as comparative examples in comparison 6 through 10. SAL603, a commercial resist used in high resolution DUV, x-ray, and e-beam imaging, was employed to provide a comparison between the nanoparticle containing resists and a commercial resist employed in advanced integrated circuit manufacturing.

TABLE 8

Composition of Resists 7 and 12 through 15.

| Name | Weight Percent $SiO_2$ (as total solids) | Weight Percent IPK-ST-S (as total weight) | Weight SAL603 (as total weight) |
|---|---|---|---|
| Resist 7 | 0% | 0% | 100% |
| Resist 12 | 25% | 25% | 75% |
| Resist 13 | 50% | 50% | 50% |
| Resist 14 | 75% | 75% | 25% |
| Resist 15 | 100% | 100% | 0% |

This demonstrates that the nanoparticles are soluble in a typical resist solvent.

COMPARISON 6

Base Dissolution Rates of Negative Acid Catalyzed Resists

The base dissolution rate of the resists was determined by spin casting a resist film on a 4 inch silicon wafer followed by hot plate baking for at 110 C for 60 seconds. The resist thickness was determined and is shown in Table 9. The resist film was then placed in a base developer, TOK NMD-3 (2.3 8% tetramethyl ammonium hydroxide), for 5, 10, 15, 20, or 30 seconds, rinsed with DI water, and remaining film thickness was measured. The resist dissolution rate was determined by the slope of a straight fine fit of resist thickness versus development time. The resist thickness remaining and the calculated dissolution rate are presented in Table 9.

TABLE 9

Base dissolution rates of Resists 7 through 15.

| Name | Thickness Initial | Thickness 5 Seconds | Thickness 10 Seconds | Thickness 15 Seconds | Thickness 20 Seconds | Thickness 30 Seconds | Dissolution Rate |
|---|---|---|---|---|---|---|---|
| Resist 7 | 443 nm | 304 nm | 207 nm | 154 nm | 0 nm | 0 nm | 21 nm/s |
| Resist 8 | 358 nm | 356 nm | 278 nm | 35 nm | 0 nm | 0 nm | 21 nm/s |
| Resist 9 | 406 nm | 354 nm | 326 nm | 190 nm | 190 nm | 0 nm | 12 nm/s |
| Resist 10 | 388 nm | 0 nm | 0 nm | 0 nm | 0 nm | 0 nm | >78 nm/s |
| Resist 11 | 430 nm | 0 nm | 0 nm | 0 nm | 0 nm | 0 nm | >863 nm/s |
| Resist 12 | 493 nm | 434 nm | 259 nm | 145 nm | 0 nm | 0 nm | 26 nm/s |
| Resist 13 | 556 nm | 426 nm | 337 nm | 138 nm | 132 nm | 0 nm | 18 nm/s |
| Resist 14 | 616 nm | 0 nm | 0 nm | 0 nm | 0 nm | 0 nm | >103 nm/s |
| Resist 15 | 543 nm | 0 nm | 0 nm | 0 nm | 0 nm | 0 nm | >108 nm/s |

The data demonstrates that Resist 11 and Resist 15, the 100% $SiO_2$ nanoparticle films, have a high dissolution rate which is four to five times higher than SAL603. This dissolution rate requires a higher degree of crosslinking to remain insoluble in developer and retain any imaged features in the exposed area of the resist. Resists 10 and 14, the 75% $SiO_2$ nanoparticle films, also have a high dissolution rate which is approximately equal to the 100% $SiO_2$ nanoparticle films. The remaining 5 resists all have similar dissolution rates and require a similar degree of crosslinking to remain insoluble in developer and retain sufficient film thickness to image features in the exposed area of the film. These 5 resists also retain sufficient resist thickness to protect the under lying substrate from further processing steps in integrated circuit fabrication. It is surprising and unexpected that even up to 50% $SiO_2$ nanoparticle incorporation in the film, the dissolution rate in base in similar to that of the control resist which contains 0% $SiO_2$. This also demonstrates that the nanopartilces are highly soluble in base developer typical of that used in the fabrication of integrated circuits.

COMPARISON 7

Bulk Lithographic Properties of Negative, Acid Catalyzed Resists

The bulk lithographic properties of the resists were determined by spin casting a resist film too approximately 400 nm on a 4 inch silicon wafer followed by hot plate baking at 110 C for 60 seconds. The resist was exposed by 50 kV electron beam on a JOEL JBX-5DII with a bulk exposure pattern consisting of a series of 300 by 300 $\mu$m pad with the exposure dose ranging from 4.0 to 16.0 $\mu C/cm^2$ in steps of 0.5 $\mu C/cm^2$. After exposure the resist was baked on a hot plate at 110 C for 60 seconds. The resist film was then placed in a base developer, Shipley LDD26W (2.38% tetramethyl At ammonium hydroxide), for 180 seconds, rinsed with DI water, and remaining film thickness was measured. The dose to retain 50% resist thickness is a measure of the sensitivity of a resist and was determined by calculating the slope of a straight line fit of the normalized resist thickness between 0% and 80% of initial resist thickness and exposure dose and determining the exposure dose which lead to 50% of the initial resist thickness remaining. The resist contrast is a measure of the lithographic potential of a of a resist and was determined by calculating the slope of a straight line fit of the normalized resist thickness between 0% and 80% of initial resist thickness and the log of the exposure dose. The resist thickness loss was determined by subtracting the initial resist film thickness from the film thickness of the area of the largest exposure dose after development. The resist dose to retain 50% thickness, contrast, and film thickness loss are presented in Table 10.

TABLE 10

Bulk lithographic properties of Resists 7, 8, 9, 12, and 13.

| Name | Dose to Retain 50% | Contrast | Film Thickness Loss |
|---|---|---|---|
| Resist 7 | 3.2 $\mu C/cm^2$ | 1.3 | 33 nm |
| Resist 8 | 1.9 $\mu C/cm^2$ | 1.0 | 35 nm |
| Resist 9 | 5.1 $\mu C/cm^2$ | 2.2 | 8 nm |
| Resist 12 | 4.8 $\mu C/cm^2$ | 2.1 | 28 mn |
| Resist 13 | 8.8 $\mu C/cm^2$ | 1.5 | 113 nm |

The data demonstrates that all resists have a low dose to retain 50% film thickness and as such all retain good sensitivity for electron beam exposure. The resists all have similar resist contrast and have similar imaging characteristics. In negative resists, the resist contrast is not as good of a predictor of lithographic imaging as with positive resists. For example, SAL603 is recognized to have excellent imaging characteristics while having a relatively low contrast. All resists have relatively low film thickness losses and as such are expected retain sufficient resist thickness to protect the under lying substrate from further processing steps in integrated circuit fabrication. The bulk imaging results of the nanoparticle containing resists relative to SAL603, a commercial resist used in high resolution e-beam imaging, suggests that nanoparticle containing resist has imaging characteristics similar to SAL603 and that the incorporation of nanoparticles does not degrade the resist imaging characteristics.

COMPARISON 8

Lithographic Imaging Properties of Negative Acid Catalyzed Resists

The imaging properties of the resists were determined by spin casting a resist film to approximately 600 nm on a 4 inch silicon wafer followed by hot plate baking for 110 C for 60 seconds. This bake is known as a post apply bake (PAB). The resist was exposed by 50 kV electron beam on a JOEL JBX-5DH with a resolution test pattern consisting of a series of equal distance fine and spaces with fine widths ranging between 200 and 600 nm and a series of isolated fines with the spacewidth three times the linewidth. The test pattern was exposed with a series of exposure doses ranging from 8.0 to 15.0 $\mu C/cm^2$, in steps of 1.0 $\mu C/cm^2$. After exposure the resist was baked on a hot plate at 110 C for 60 seconds. This bake is known as a post exposure bake (PEB). The resist film was then placed in a base developer, Shipley LLD-26W (2.38% tetramethyl ammonium hydroxide), for 180 seconds and rinsed with DI water. The dense resolution was determined by noting the smallest printed fines that had a linewidth that approximately equaled the nominal finewidth. The dose to size was determined by noting the exposure dose required to image resolution test pattern when the linewidth approximately equal to the spacewidth. The resist dose to size and resolution are presented in Table 11.

TABLE 11

Lithographic imaging properties of Resists 7, 8, 9, 11, and 12.

| Name | Dose to SizeRetain 50% | Dense Resolution |
|---|---|---|
| Resist 7 | 9.0 $\mu C/cm^2$ | 300 nm |
| Resist 8 | 8.0 $\mu C/cm^2$ | 300 nm |
| Resist 9 | 8.0 $\mu C/cm^2$ | 300 nm |
| Resist 11 | 8.0 $\mu C/cm^2$ | 300 nm |
| Resist 12 | 15.0 $\mu C/cm^2$ | 300 nm |

The above data demonstrate that the nanoparticle resists 7, 8, 11, and 12 are capable of high resolution imaging and that resists 7, 8, and 11 have similar resolution characteristics to SAL603. This result is surprising in that the resist process was not optimized, and that with process optimization, improved resolution could be obtained. It is also surprising that a resist that depends on crosslinking to render the resist insoluble, can still be sufficiently crosslinked to give high resolution even with up to 50% $SiO_2$ in the resist.

COMPARISON 9

Oxygen Plasma Etch Properties of Negative Acid Catalyzed Resists

The oxygen plasma etch properties of the resists were determined by spin casting a resist film too approximately 300 nm on a 4 inch silicon wafer followed by hot plate baking for at 110 C for 60 seconds. The resist was plasma etched in a single wafer Oxford Plasma Technologies plasma etcher in RIE mode for 1.0, 2.5, or 5.0 minutes. Etch conditions were an oxygen flow rate of 40 sccm, a pressure of 15 mTorr, applied power of 250 watts, and a DC bias of −455 volts. The thickness of the resist film was determined after plasma etch and the plasma etch depth calculated by subtracting the film thickness after etch from the initial film thickness. The plasma etch rate was determined by a straight line fit of the plasma etch depth versus plasma etch time. The plasma etch rates of the resists are presented in Table 12 as are the etch rates normalized to Resist 7 (SAL603). Resist 7 was completely removed in the first minute and the etch rate given reflects the minimum etch rate.

TABLE 12

Oxygen plasma etch rates of Resists 7 through 15.

| Name | Etch Depth (1.0 nm) | Etch Depth (2.5 min) | Etch Depth (5.0 min) | Plasma Etch Rate | Normalized to Resist 7 |
|---|---|---|---|---|---|
| Resist 7 | 240 nm | NA | NA | >240 nm/min | 1.00 |
| Resist 8 | 80 nm | 220 nm | 240 nm | 93 nm/min | 0.39 |
| Resist 9 | 7 nm | 32 nm | 80 nm | 18 nm/min | 0.08 |
| Resist 10 | 6 nm | 10 nm | 45 nm | 10 nm/min | 0.04 |
| Resist 11 | 5 nm | 10 nm | 30 nm | 6 nm/min | 0.04 |
| Resist 12 | 80 nm | 200 nm | 400 nm | 80 nm/min | 0.33 |
| Resist 13 | 10 nm | 30 nm | 80 nm | 18 nm/min | 0.08 |
| Resist 14 | 10 nm | 10 nm | 35 nm | 12 nm/min | 0.05 |

The above data demonstrates that the addition of $SiO_2$ nanoparticles, to a resist dramatically reduces the plasma etch rate. A reduced plasma etch rate is a major improvement to the resist technology. At 25% nanoparticles, the etch rate is reduced by a half to a third. This reduction may even be better as all of Resist 7 was removed in the first minute of etch and the comparative rate of 240 nm/min represents a minimum etch rate and not the actual etch rate which could be greater. At higher level of 50%, where the lithographic imaging is comparable to SAL603, the etch rate is reduced by over a factor of ten. It appears that the greatest reduction in etch rate comes with the addition of $SiO_2$ nanoparticles at levels of up to 50%. Surprisingly, at levels higher then 50%, the addition of more nanoparticles does not offer a significantly greater level of etch rate reduction. These results are significant and show that the incorporation of $SiO_2$ nanoparticles into a resist leads to a dramatic improvement in the resist's ability to resist plasma etch.

COMPARISON 10

Chlorine Plasma Etch Properties of Negative Acid Catalyzed Resist

The chlorine plasma etch properties of the resists were determined by spin casting a resist film to approximately 300 nm on a 4 inch silicon wafer followed by hot plate baking for at 110 C for 60 seconds. The resist was plasma etched in a single wafer Oxford Plasma Technologies plasma etcher in RIE mode for 1.0, 2.5, or 5.0 minutes. Etch conditions were a chlorine flow rate of 13 sccm, a pressure of 20 mTorr, applied power of 153 watts, and a DC bias of −250 volts. The thickness of the resist film was determined after plasma etch and the plasma etch depth calculated by subtracting the film thickness after etch from the initial film thickness. The plasma etch rate was determined by a straight line fit of the plasma etch depth versus plasma etch time. The plasma etch rates of the resists are presented in Table 13 as are the etch rates normalized to Resist 7 (SAL603). Resist 7 was completely removed in five minutes and the etch rate given reflects a straight fine fits of only the first two time intervals.

TABLE 13

Chlorine plasma etch rates of Resists 7 through 15.

| Name | Etch Depth (1.0 nm) | Etch Depth (2.5 min) | Etch Depth (5.0 min) | Plasma Etch Rate | Normalized to Resist 7 |
| --- | --- | --- | --- | --- | --- |
| Resist 7 | 86 nm | 191 | NA | 70 nm/min | 1.00 |
| Resist 8 | 35 nm | 90 nm | 125 nm | 22 nm/min | 0.31 |
| Resist 9 | 30 nm | 60 nm | 94 nm | 16 nm/min | 0.23 |
| Resist 10 | 23 nm | 53 nm | 80 nm | 14 nm/min | 0.20 |
| Resist 11 | 17 nm | 40 nm | 70 nm | 13 mn/min | 0.19 |
| Resist 12 | 59 nm | 130 nm | 175 nm | 28 nm/min | 0.4 |
| Resist 13 | 45 nm | 62 nm | 128 nm | 21 nm/min | 0.30 |
| Resist 14 | 23 nm | 52 nm | 89 nm | 16 nm/min | 0.23 |
| Resist 15 | 19 nm | 37 nm | 60 nm | 10 nm/min | 0.14 |

The above data demonstrates that the addition of $SiO_2$ nanoparticles to a resist dramatically reduces the plasma etch rate. A reduced plasma etch rate is a major improvement to the resist technology. At 25% nanopartictes, the etch rate is reduced by a half to a third. At higher levels of 50%, where the lithographic imaging is comparable to SAL603, the etch rate is reduced by up to a factor of five. It appears that the greatest reduction in etch rate comes with the addition of $SiO_2$ nanoparticles at levels of up to 50%. Surprisingly, at levels higher then 50%, the addition of more nanoparticles does not offer a significantly greater level of etch rate reduction. These results are significant and show that the incorporation of $SiO_2$ nanoparticles into a resist leads to a dramatic improvement in the resist's ability to resist plasma etch.

Preparation of Positive Acid Catalyzed Resists EIRT-98013, EIRT-98022, and EIRT-98023

The resist EIRT-98013 was prepared by combining 17.280 grams of a copolymer of 65% p-hydroxystyrene and 35% t-butyl acrylate, 0.720 grams of di-(4-t-butylphenyl)iodonium 10-camphorsulfonate, 0.450 grams of 40% tetrabutyl ammonium hydroxide, and 81.595 grams of ethyl lactate. The resulting solution was rolled overnight and filtered to 0.2 micrometers.

A solution was prepared of 100 ml of IPA-ST-S (30% $SiO_2$ in isopropyl alcohol from Nisson Chemical) and 100 ml of ethyl lactate. The isopropyl alcohol was removed by distillation to leave a solution of $SiO_2$ in ethyl lactate. This solution was filtered to 0.8 micrometers and stirred for 60 minutes in an ultrasonic bath. The solution was diluted with ethyl lactate to give an 18% by weight solution $SiO_2$ in ethyl lactate.

Nanoparticle-polymer solution 1 was prepared by adding a solution of 14.4 grams of a copolymer of 60% p-hydroxystyrene and 40% t-butyl acrylate in 65.6 grams of ethyl lactate to a stirred solution of 20 grams of 18% $SiO_2$ in ethyl lactate.

The resist EIRT-98022 was prepared by combining 49.421 grams of a nanoparticle-polymer solution 1, 0.371 grams of di-(4-t-butylphenyl)iodonium 10-camphorsulfonate, and 0.232 grams of 40% tetrabutyl ammonium hydroxide. The resulting solution was rolled overnight and used without filtration.

Nanoparticle-polymer solution 2 was prepared by adding a solution of 12.6 grams of a copolymer of 50% p-hydroxystyrene and 50% t-butyl acrylate in 57.4 grams of ethyl lactate to a stirred solution of 30 grams of 18% $SiO_2$ in ethyl lactate.

Nanoparticle-polymer solution 3 was prepared by adding a solution of 10.8 grams of a copolymer of 50% p-hydroxystyrene and 50% t-butyl acrylate in 49.2 grams of ethyl lactate to a stirred solution of 40 grams of 18% $SiO_2$ in ethyl lactate.

The resist EIRT-98023 was prepared by combining 16.309 grams of a nanoparticle-polymer solution 2, 33.112 grams of a nanoparticle-polymer solution 3, 0.371 grams of di-(4-t-butylphenyl)iodonium 10-camphorsulfonate, and 0.232 grams of 40% tetrabutyl ammonium hydroxide. The resulting solution was rolled overnight and used without filtration.

Substrates for electron beam and 157-nm lithography were 4-inch silicon wafers. Substrates for 248-nm lithography were 6-inch silicon wafers coated with 65 nm of Shipley AR3 baked at 195° C. for 60 seconds. E-beam exposures were with a JEOL JBX-5DII e-beam tool operating at 50 kV. The PAB was 130° C. for 60 seconds and PEB was 130° C. for 90 seconds. Development was by immersion for 60 seconds with 2.38% TMAH developer. Lithography at 248-nm was by either a GCA XLS (NA=0.48) or a Cannon EX4 (NA=0.60). For EIRT-98013, EIRT-98022 (19.15% $SiO_2$), and EIRT-98023 (35.14% $SiO_2$), the PAB was 140 ° C. for 60 seconds and PEB was 130° C. for 90 seconds. Development was by single puddle for 40 seconds with 2.38% TMAH developer followed by a 10 second immersion in BOE and DI water rinse. Lithography at 157-nm was by a laboratory class projection system with a Schwartzchild lens (NA=0.50). Development was by immersion for 20 seconds with 2.38% TMAH developer.

Plasma etch was with a Oxford/Plasma Technology Plasmalab AMR. Oxygen RIE was performed at a pressure of 10 mTorr, with 200 Watts of RF power, and an oxygen flow of 40 SCCM. Measured DC bias was −460 volts. Chlorine RIE was performed at a pressure of 10 mTorr, 150 Watts of RF power, and a chlorine flow of 20 SCCM. Measured DC bias was −370 volts.

Dissolution rate measurements were made with a Perkin Elmer 5900 Development Rate Monitor on either polymer or resist coated silicon. Film thickness ranged from 800 to 1000 nm and PAB conditions were 140° C. for 60 seconds. The dissolution rate was determined by a linear fit of the film thickness and dissolution time.

The development of a resist system ultimately capable of sub-100-nm resolution with high plasma etch selectivity required that the EIRT resists be capable in the wide array of advanced imaging scheme currently under consideration for nanometer lithography. These resists show sufficient flexibility to image under a variety of variety of advanced imaging techniques such as X-rays, EUV, low- and high-kV electrons, ion beams, and extended optical wavelengths. Examples imaging with both 50 kV electron beams and 248-nm DUV wavelength are provided below. The use of transparent $SiO_2$ nanoparticles makes the EIRT resist system especially useful for sub-200-nm wavelengths especially 193 and 157-nm where improved plasma etch resistance can be imparted by the use of the thicker transparent EIRT resists.

Electron Beam Lithography

Initial lithography was performed with electron beam imaging and compared and compared with Shipley UV5, a commercial DUV resist, based on traditional organic polymers, that has shown promise as an electron beam resist. The $SiO_2$ containing resists, formulated to be similar to UV5, were prepared to contain 20, 33, and 50% 10–20 nm diameter $SiO_2$ nanoparticles (weight $SiO_2$ to weight of total solids). As shown in FIG. 1, the resists containing 33 and 50% $SiO_2$ exhibit increased dark loss and reduced resist contrast when compared to UV5. The increased sensitivity relative to UV5 is likely to be a result of the lower level of dissolution inhibition of these two resists compared to UV5. What was somewhat surprising is that the resist containing 20% $SiO_2$ had a bulk lithography performance identical to that of UV5 in terms of sensitivity, contrast, and dark loss. Thus at levels of 20% added $SiO_2$, the lithography is little changed from that of a resist which does not contain the $SiO_2$ nanoparticles.

The effect adding of 20% $SiO_2$ nanoparticles to a resist on actual resist imaging performance was determined. FIG. 2 shows SEM images of the electron beam lithography of UV5 and a similar resist containing 20% $SiO_2$ nanoparticles. The 200 and 300 nm dense and isolated lines were the smallest features written and evaluated with the electron beam pattern. The SEM images show that little difference exists in either resolution or resist profiles between the UV5 and the $SiO_2$ containing resist. This initial imaging result was very encouraging and prompted a study to evaluate the effect of added $SiO_2$ on plasma etch resistance and also to determine what level of $SiO_2$ in the resist is need to substantially improve the plasma etch resistance of the resist.

Plasma Etching

The RIE etch rates of resists containing 10, 20, 33, and 50% $SiO_2$ nanoparticles were compared to UV5 and a film of pure $SiO_2$ nanoparticles. The results of etching the six films in both oxygen and chlorine plasma are seen in FIG. 3 and summarized in Table 14. The improvement in plasma etch resistance is most dramatic in the oxygen RIE plasma where even the addition on only 10% $SiO_2$ decreases the plasma etch rate by half. More importantly, the incorporation of 20% $SiO_2$, an amount that gives electron beam imaging similar to UV5, reduces the plasma etch rate to a quarter of the original rate. It is clear that as $SiO_2$ content is increased further, the etch rate in an oxygen plasma contin- ues to decrease. This reduction in plasma etch rate translates to a 4 to 20 times improvement in plasma etch selectivity over UV5 at $SiO_2$ levels of 20 to 50%.

TABLE 14

Comparison of RIE Etch Rates of Resists in an Oxygen and Chlorine Plasma

| Resist | Percent $SiO_2$ | Oxygen Etch Rate (nm/min) | Chlorine Etch Rate (nm/min) |
| --- | --- | --- | --- |
| UV5 | 0% | 188 | 95 |
| 10% SiO2 Resist | 10% | 100 | 63 |
| 20% SiO2 Resist | 20% | 50 | 52 |
| 33% SiO2 Resist | 33% | 18 | 42 |
| 50% SiO2 Resist | 50% | 9 | 28 |
| SiO2 | 100% | 3 | 20 |

The chlorine plasma etch rate also decreases with increasing levels of $SiO_2$ incorporation into the resist. The addition of 20% $SiO_2$ to the resist lowers the chlorine RIE etch rate by half and incorporation of 50% $SiO_2$ into the resist reduces the etch rate by a third. It should be noted that both the oxygen and chlorine plasmas were run at relatively high DC bias of –460 volts and –370 volts and thus have a significant nonselective sputter etch component. Plasma etch process optimization lead to further improvements in etch selectivity of the $SiO_2$ resists very a traditional polymeric organic resist.

The results combined with the previous electron beam results demonstrate that resists developed from the encapsulated inorganic resist technology concept can both image similarly to a commercial resist and exhibit improved plasma etch resistance. This makes the EIRT resist concept a candidate for both single layer resists and the top imaging layer of bilayer resist scheme.

248-nm Lithography (Dissolution behavior)

The higher degree of dark loss seen with the 33 and 50% $SiO_2$ containing resist prompted an investigation into the relationship between the dissolution rate of the resists, the amount of $SiO_2$ incorporation, and the copolymer ratio. Solutions were prepared of 20, 30, 40, 50, and 60% 8–10 nm diameter $SiO_2$ nanoparticles in a p-hydroxystyrene t-butyl and acrylate copolymer matrix. The dissolution rate in 2.38% TMAH is seen in FIG. 4 and Table 15. One clear observation arising out of Table 15 is that the $SiO_2$ nanoparticles are exceedingly soluble in base and act as dissolution accelerators when mixed with normally low dissolution rate polymers. The dissolution acceleration is so great that incorporation of 30% $SiO_2$ is enough to increase the dissolution rate by a factor of about twenty five. Note that the dissolution rates in the table are rounded as zero for two films, when it actually measures in tenths of nanometers per seconds.

TABLE 15

Dissolution rate in 2.38% TMAH of polymer films containing SiO$_2$ with differing ratios of p-hydroxystyrene (HOST) to t-butyl acrylate (TBA) in the copolymer.

| Percent SiO$_2$ in Film | Film Dissolution Rate (nm/sec) | | |
|---|---|---|---|
| | HOST/TBA: 65/35 | HOST/TBA/ 60:40 | HOST/TBA: 50/50 |
| 0% | 2 | 1 | 0 |
| 20% | 11 | 4 | 0 |
| 30% | 46 | 24 | 4 |
| 40% | 227 | 90 | 28 |
| 50% | 753 | 468 | 179 |
| 60% | 1502 | 927 | 872 |
| 100% | 3042 | 3042 | 3042 |

The dissolution rates of the three a p-hydroxystyrene t-butyl and acrylate copolymers as a function of SiO$_2$ incorporation in the film are presented in FIG. 4 as log of the dissolution rate versus the percent SiO$_2$. Within the 20 to 60% SiO$_2$ range, there exists a linear relationship between log of the dissolution rate versus the percent SiO$_2$. This is an indication that dissolution of the SiO$_2$-polymer film follow a percolation model and that this model can be used to adjust material dissolution rates. Increasing the amount of t-butyl acrylate in the copolymer offsets the expected increase in dissolution rate associated with adding SiO$_2$ to the film. Thus, varying the monomer ratio in the copolymer along with the percent SiO$_2$ incorporation can yield a SiO$_2$-polymer film with similar dissolution to that of the polymer without any added SiO$_2$. This has been accomplished and the results are shown in FIG. 5.

The contrast curves seen in FIG. 5 compare three different all based on the p-hydroxystyrene t-butyl and acrylate copolymer. The resists were exposed on a GCA XLS (NA =0.48) 248 nm stepper. The dark loss of the two SiO$_2$ containing resists is comparable to that of the resist lacking SiO$_2$. Sensitivity and contrast are also similar for the three resists although increasing levels of SiO$_2$ due lead to increased sensitivity in this example. An example of isolated line imaging at 248-nm is presented in FIG. 6, where isolated lines are resolved down to 225 nm for the resist containing 20% SiO$_2$ while the resist containing only polymer images down to 200 nm. Thus, manipulating the monomer composition in the copolymer to compensate for the increased dissolution of the SiO$_2$ containing film can be used to match the dissolution rate found in resists containing only polymers. This adjustment also leads to lithographic performance of EIRT resists similar to control resists lacking SiO$_2$ in the resist formulation.

In all cases the EIRT resists have shown lithographic performance equivalent to control resists containing no SiO$_2$ incorporation. RIE etch rates in oxygen and chlorine plasmas are significantly reduced versus a commercial resist showing that the addition of SiO$_2$ containing nanoparticles is very effective at reducing the RIE etch rate of resists, and provides a proof of concept that EIRT resists can have dramatically improved plasma etch rates. Finally, both material and lithographic evaluation showed that encapsulated inorganic materials have properties compatible with current resist technology and are capable of printing complex and varied patterns while maintaining process simplicity and compatibility with other fabrication steps.

Those of ordinary skill in the art will know, or be able to ascertain, using no more than routine experimentation, many equivalents to the specific embodiments of the invention described herein. These and all other equivalents are intended to be encompassed by the following claims. All publications and references cited herein, including those in the background section, are expressly incorporated herein by reference in their entirety.

What is claimed is:

1. A positive photosensitive resist composition comprising a resin binder and an encapsulated inorganic material comprising core particles having an average size less than about 10 nanometer, wherein the photoresist is sufficiently base soluble upon activation by radiation to function as a positive resist.

2. The positive photosensitive resist composition of claim 1, wherein the binder is a t-butyl blocked polyvinyl phenol.

3. The positive photosensitive resist composition of claim 1, wherein the binder is a polyvinylphenol and t-butyl acrylate copolymer.

4. The positive photosensitive resist composition of claim 1, wherein the binder is a polyvinylphenol, t-butyl acrylate and styrene terpolymer.

5. The positive photosensitive resist composition of claim 1, wherein the binder is a DNQ novalak binder.

6. The positive photosensitive resist composition of claim 1, wherein the encapsulated inorganic material is silicon dioxide.

7. The positive photosensitive resist composition of claim 1, wherein the encapsulated inorganic material is aluminum oxide.

8. The positive photosensitive resist composition of claim 1, wherein the encapsulated inorganic material is titanium oxide.

9. The positive photosensitive resist composition of claim 1, wherein the content of the encapsulated inorganic resist material is between about 0.1% and about 90% by weight of the positive photosensitive resist composition.

10. The positive photosensitive resist composition of claim 1, wherein the content of the encapsulated inorganic material is between about 5% and about 75% by weight of the positive photosensitive resist composition.

11. The positive photosensitive resist composition of claim 1, wherein the content of the encapsulated inorganic material is between about 20% and about 50% by weight of the positive photosensitive resist composition.

12. The positive photosensitive resist composition of claim 1, wherein the binder and the encapsulated inorganic material form a clear positive photosensitive resist composition.

13. The positive photosensitive resist composition of claim 1, further comprising a surfactant.

14. The positive photosensitive resist composition of claim 1, further comprising a solvent.

15. The positive photosensitive resist composition of claim 1, wherein the encapsulated inorganic material further comprises core particles having an average size less than about 5 nm.

* * * * *